United States Patent [19]
Ikeda et al.

[11] Patent Number: 6,081,157
[45] Date of Patent: *Jun. 27, 2000

[54] TUNING CIRCUIT

[75] Inventors: Takeshi Ikeda, 5-6-213, San-no 2-chome, Ohta-ku, Tokyo 143; Tadataka Ohe, Saitama; Tsutomu Nakanishi, Tokyo, all of Japan

[73] Assignee: Takeshi Ikeda, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/860,402

[22] PCT Filed: Jan. 11, 1996

[86] PCT No.: PCT/JP96/00026

§ 371 Date: Jun. 23, 1997

§ 102(e) Date: Jun. 23, 1997

[87] PCT Pub. No.: WO96/21970

PCT Pub. Date: Jul. 18, 1996

[30] Foreign Application Priority Data

Jan. 12, 1995 [JP] Japan ..................................... 7-021120

[51] Int. Cl.[7] ..................................................... H03F 3/191
[52] U.S. Cl. ............................................ 330/107; 330/305
[58] Field of Search ..................................... 330/107, 302, 330/305, 306, 310, 311

[56] References Cited

U.S. PATENT DOCUMENTS 3,969,682  7/1976  Rossum ............................... 330/306 X
4,246,542  1/1981  Thanos .................................... 330/107
4,663,597  5/1987  Benzinger et al. ..................... 330/107

FOREIGN PATENT DOCUMENTS 48-35745  5/1973  Japan .
49-96848  8/1974  Japan .
51-18448  2/1976  Japan .
61-73411  4/1986  Japan .
 2-65309  3/1990  Japan .
 5-75384  3/1993  Japan .

*Primary Examiner*—Steven J. Mottola
*Attorney, Agent, or Firm*—Dellett and Walters

[57] ABSTRACT

A tuning circuit which has a wide tuning bandwidth. The tuning bandwidth of the tuning frequency can be easily changed. The tuning circuit 1 is composed of two cascade-connected tuning amplifier sections 2 and 3. Each of the sections 2 and 3 is provided with cascade-connected phase-shifting circuits 10C and 30C, a voltage dividing circuit 60, and an adding circuit composed of a feedback resistor 70 and an input resistor 74. Prescribed tuning operation is performed by shifting the phase of a prescribed frequency by 360° by means of the phase shifting circuits 10C and 30C and setting the open loop gain of a feedback loop at less than 1 when the output of the voltage dividing circuit 60 is feedback. The resistance ratio between the feedback resistor 70 and input resistor 74 of each tuning amplifier section is adjusted in order that the maximum damping of each tuning amplifier section becomes smaller and the tuning bandwidth of each amplifier section becomes wider. Therefore, since the tuning amplifier sections are cascade-connected, the maximum damping is increased and the tuning bandwidth is widened as a whole.

54 Claims, 24 Drawing Sheets

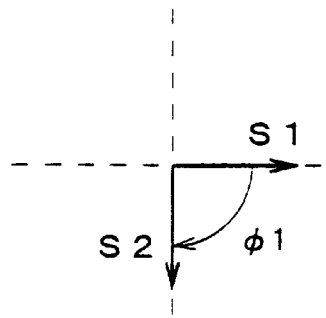
FIG. 7.(A)
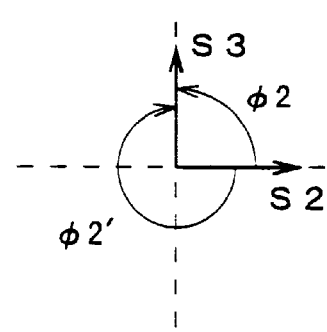
FIG. 7.(B)
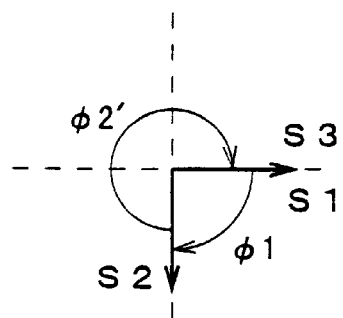
FIG. 7.(C)
FIG. 8.
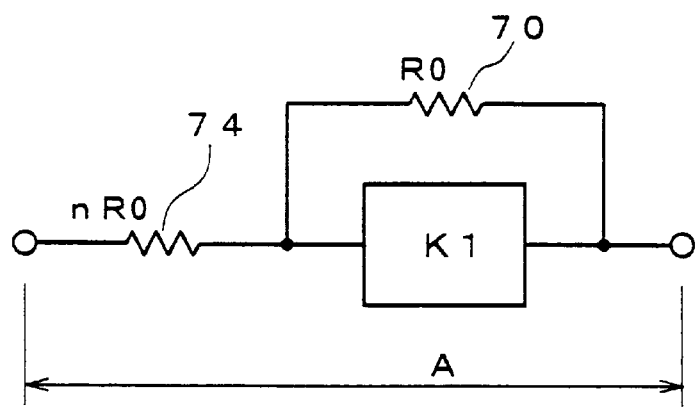
FIG. 9.
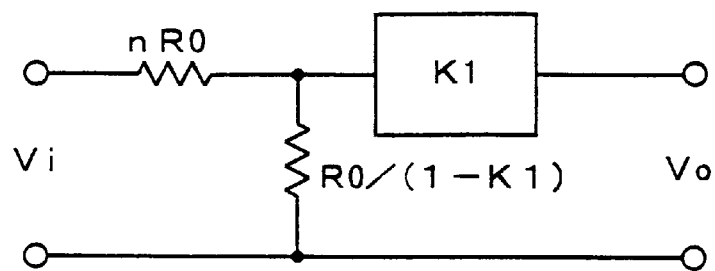

6,081,157

TUNING CIRCUIT

TECHNICAL FIELD

The present invention relates to a tuning circuit easily adapted to an integrated circuit and capable of selectively providing as an output any desired frequency component in an input signal.

BACKGROUND OF ART

Generally, tuning circuits for receiving a video signal in a television receiver and the like require to have a relatively wide frequency bandwidth and thus use, for example, staggered tuning amplifiers. The staggered tuning amplifiers are a combination of plural stages of single tuning circuits, each adapted to choose a narrow frequency bandwidth signal, to provide a wide frequency bandwidth and a given amplification factor as a whole. Such amplifiers find wide applications not only in the above mentioned television receivers but also in intermediate frequency amplifiers for radar systems, etc.

A plurality of single tuning amplifiers constituting the above mentioned conventional staggered tuning amplifiers comprise a combination of resonance circuits, each including typically an inductor and a capacitor. By shifting the resonance frequencies by a given frequency from one another, a relatively flat, wide frequency bandwidth tuning characteristic may be obtained as a whole. Tuning frequencies in such staggered tuning amplifiers are determined by inductors and capacitors to be used as pairs. However, any attempt to obtain a wide frequency bandwidth by combining, for example, two stages of single tuning amplifiers with a certain frequency difference may result in a non-flat tuning characteristic with undesirable attenuation in the intermediate or center frequency range. This leads to a conclusion that the number of cascade connected, single tuning amplifier stages must be increased for wider frequency characteristic. In varying tuning frequencies of three or more stages of tuning amplifiers, the resonance frequency of each single tuning amplifier must be controlled in harmony with those in the other amplifiers, thereby making the control very complicated and subjecting to substantial change in characteristic when the tuning frequencies are varied. This is believed to be the reason why the tuning frequencies have never been varied in practical use. In a heterodyne system, for example, signal is processed after being converted into an intermediate frequency and thus the tuning frequency is maintained constant.

DISCLOSURE OF INVENTION

It is the object of the present invention to solve the above problems and to provide a tuning circuit having a wider tuning frequency bandwidth, capable of easily varying the tuning frequency bandwidth or the tuning frequency, and suitable to adapt to an integrated circuit.

The tuning circuit in accordance with the present invention comprises a plurality of cascade connected tuning amplifier sections, each having a substantially equal tuning frequency. Each of the tuning amplifier sections comprises an adding circuit for adding an input signal applied to one end of an input impedance element and a feedback signal applied to one end of a feedback impedance element, two phase shifting circuits of opposite phase shift directions to each other and including a series circuit of a first resistor and a capacitor or an inductor and a differential input amplifier, and a first voltage dividing circuit for dividing an input AC signal by a predetermined dividing ratio. The two phase shifting circuits and the first voltage dividing circuit are connected in a cascade manner. The added signal from the adding circuit is applied to the front stage circuit of the cascade connected circuits and the signal from the final stage is applied to one end of the feedback impedance element as the feedback signal. An output signal is derived from a circuit point before being divided by the voltage dividing circuit.

Also, the tuning circuit according to the present invention comprises a plurality of cascade connected tuning amplifier sections having sequentially different tuning frequencies by a given frequency. Each of the tuning amplifier sections comprises an adding circuit for adding an input signal applied to one end of an input impedance element and a feedback signal applied to one end of a feedback impedance element, two phase shifting circuits of opposite phase shift directions to each other and including a series circuit of a first resistor and a capacitor or an inductor and a differential input amplifier, and a first voltage dividing circuit for dividing an input AC signal by a predetermined dividing ratio. The two phase shifting circuits and the first voltage dividing circuit are connected in a cascade manner with the first stage circuit of the cascade connected circuits receiving the added signal from the adding circuit while the output signal from the final stage circuit applied to one end of the feedback impedance element as the feedback signal. An output signal is derived from a circuit point before being divided by the voltage dividing circuit.

BRIEF DESCRIPTION OF THE DRAWINGS

FIGS. 7A, 7B and 7C show the phase relationship between the input and output signals of the two phase shifting circuits included in the tuning amplifier section.

FIG. 8 is a circuit schematic of the two phase shifting circuits and the voltage dividing circuit included in the tuning amplifier section represented by a circuit having the equivalent transfer function.

FIG. 9 is a circuit schematic in FIG. 8 converted by the Miller's principle.

BEST MODE FOR CARRYING OUT THE INVENTION

Figure 1:
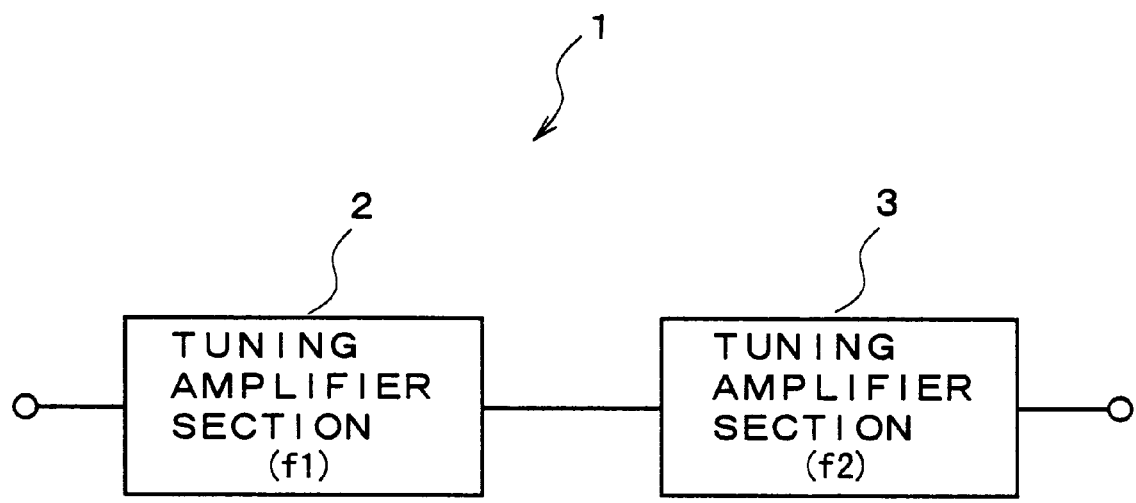
FIG. 1 is a block diagram of the tuning circuit to which the present invention is applied.

FIG. 1 is a block diagram to show the principle of one embodiment of the tuning circuit to which the present invention is applied. The tuning circuit 1 in FIG. 1 comprises a cascade connection of a first tuning amplifier section 2 and a second tuning amplifier section 3.

The tuning frequency of the first tuning amplifier section 2 is set to f1 for extracting or picking up only signal components of the input signal applied to the input terminal whose frequency is close to f1. While the second tuning amplifier section 3 is set to f2 in the tuning frequency for providing from the output terminal signal components from the first tuning amplifier section 2 having frequency close to f2. Note that the tuning frequencies f1, f2 of the first and second tuning amplifier sections 2, 3 are set substantially equal (including exactly equal) to each other. (First Embodiment of the Tuning Amplifier Section)

Figure 2:
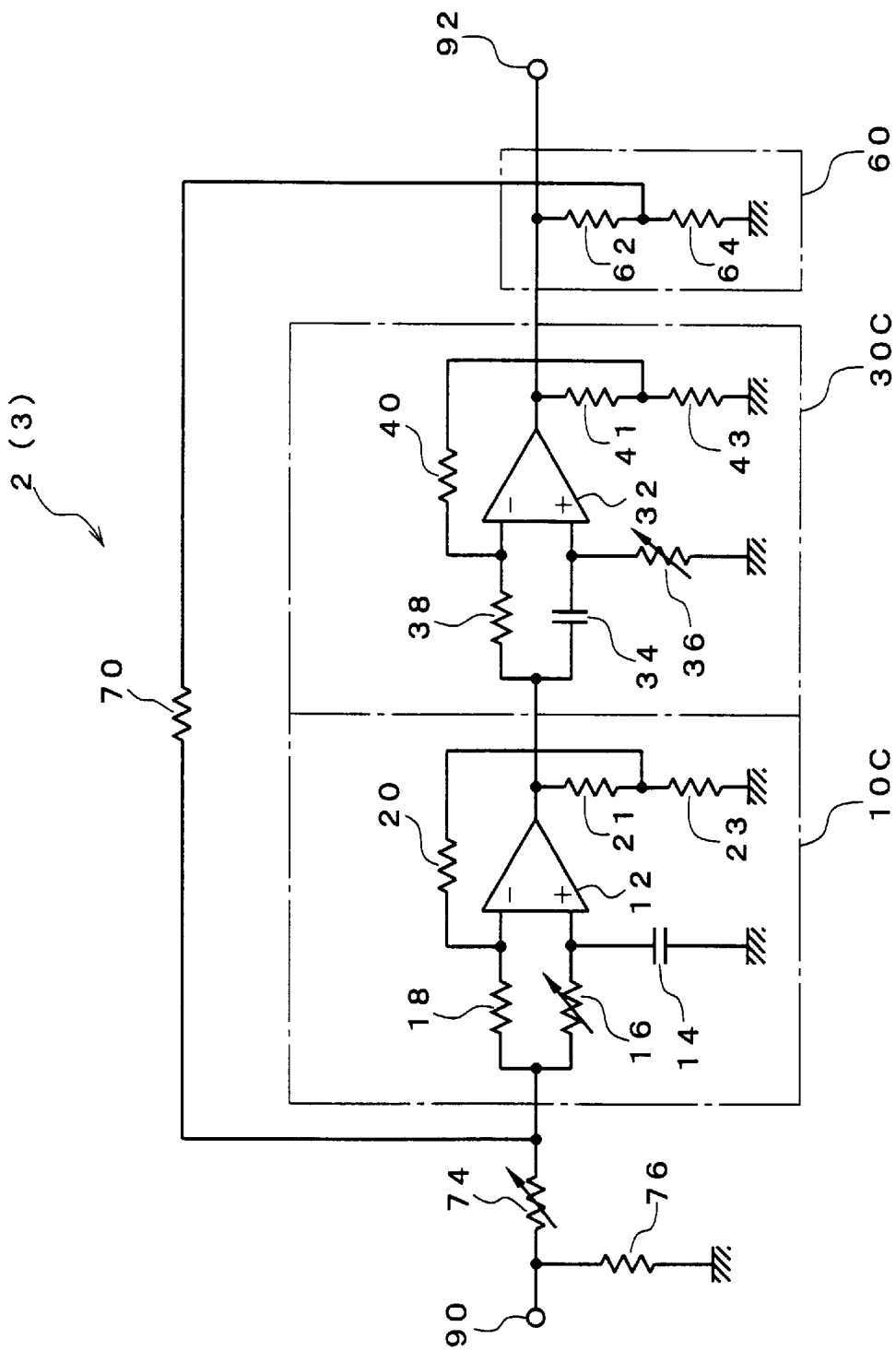
FIG. 2 is a circuit schematic of each tuning amplifier section in FIG. 1.

Illustrated in FIG. 2 is a circuit schematic of one tuning amplifier section 2 mentioned above. It is to be noted that the other tuning amplifier section 3 may have the same construction.

The tuning amplifier section 2 in FIG. 2 includes two phase shifting circuits 10C, 30C for shifting the phase of the AC signal applied thereto by a certain phase angle to provide 360° overall phase shift at a certain frequency, a voltage dividing circuit 60 comprising resistors 62, 64 connected to the output of the subsequent stage phase shifting circuit 30C, and an adding circuit to add with a predetermined ratio the divided output (feedback signal) from the voltage dividing circuit 60 and the signal (input signal) applied to the input terminal 90 by way of a feedback resistor 70 and an input resistor 74, respectively. (Note that the input resistor 74 has n-times of resistance of the feedback resistor 70.)

Figure 3:
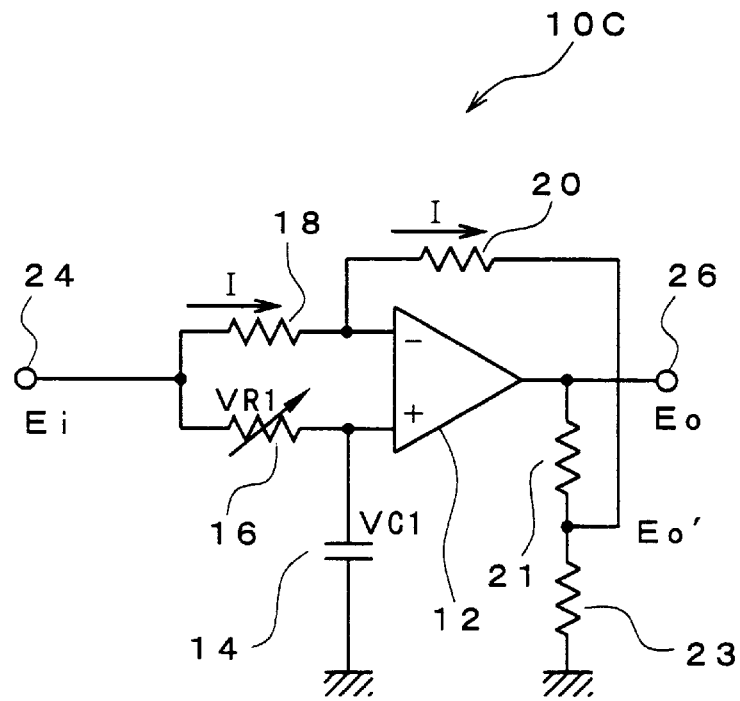
FIG. 3 is a circuit schematic of the phase shifting circuit at the first stage in FIG. 2.

FIG. 3 shows only the front or preceding stage of the phase shifting circuit 10C in FIG. 2, which comprises an operational amplifier 12 in a form of a differential input amplifier, a variable resistor 16 and a capacitor 14 for shifting the phase of an input AC signal applied to an input terminal 24 before being applied to the non-inverting input terminal of the operational amplifier 12, a resistor 18 interposed between the input terminal 24 and an inverting input terminal of the operational amplifier 12, resistors 21, 22 defining a voltage dividing circuit connected to the output terminal of the operational amplifier 12, and a resistor 20 interposed between the voltage dividing circuit and the inverting input terminal of the operational amplifier 12.

In the phase shifting circuit 10C as configured above, the resistors 18, 20 are chosen to have equal resistance to each other.

When an AC signal is applied to the input terminal 24 in FIG. 3, applied to the non-inverting input terminal of the operational amplifier 12 is the voltage VC1 appearing across the capacitor 14. Note that no potential difference does exist between the two input terminals of the operational amplifier 12, thereby equalizing the potential on the inverting input terminal of the operational amplifier 12 and the potential on the junction of the variable resistor 16 and the capacitor 14. Consequently, the voltage across the resistor 18 is equal to the voltage VR1 across the variable resistor 16.

It is to be noted that the same current I flows through both resistors 18, 20 which have equal resistance as described above. This means that the same voltage VR1 develops across the resistor 20. The voltage VR1 across each of the two resistors 18, 20 has the same vector. With reference to the voltage VC1 on the non-inverting input terminal of the operational amplifier 12, vector summation of the voltage VR1 across the resistor 18 defines the input voltage Ei while vector subtraction of the voltage VR1 across the resistor 20 defines the voltage Eo' (output from the voltage dividing circuit) on the junction of the resistors 21, 23.

The output from the phase shifting circuit 10C is derived directly from the output terminal of the operational amplifier 12 rather than through the voltage dividing circuit comprising the above mentioned resistors 21, 23.

Figure 4:
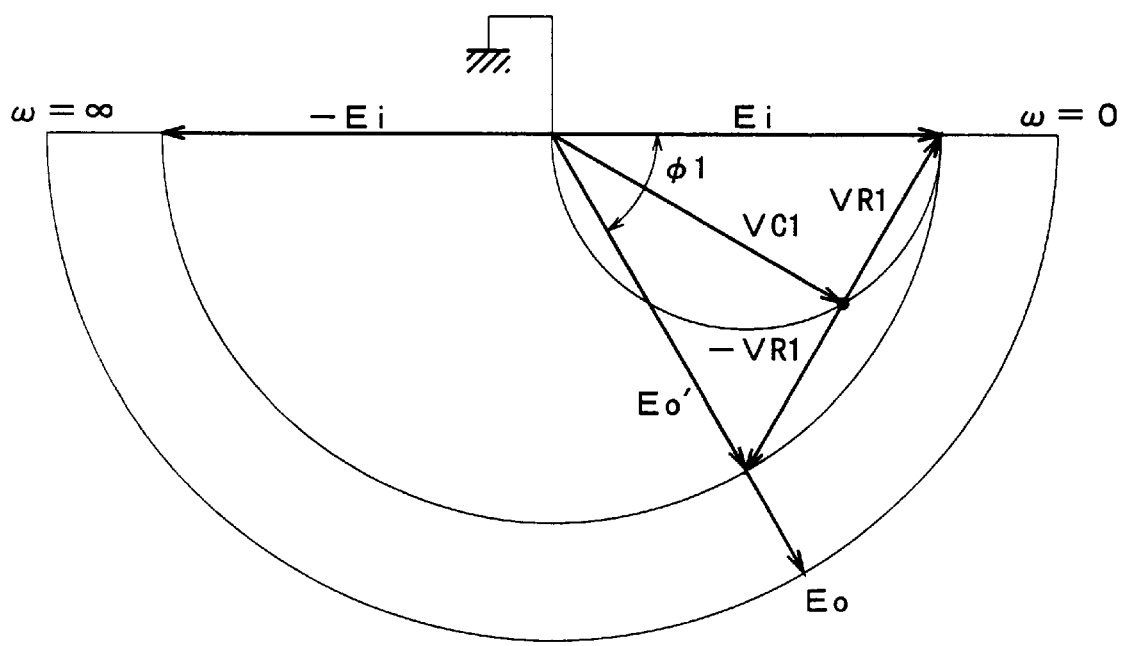
FIG. 4 is a vector diagram showing the relationship between the input and output voltages and the voltage across a capacitor and like in the phase shifting circuit as shown in FIG. 3.

Illustrated in FIG. 4 is a vector diagram showing the relationship between the input and output voltages of the front stage phase shifting circuit 10C and the voltage across the capacitor.

As shown in FIG. 4, the voltage VC1 across the capacitor 14 and the voltage VR1 across the variable resistor 16 are 90° out of phase from each other. Vector summation (addition) of VC1 and VR1 leads to the input voltage Ei. As the frequency varies while maintaining the input signal amplitude constant, the voltage VC1 across the capacitor 14 and the voltage VR1 across the variable resistor 16 vary along the smallest semicircle in FIG. 4.

On the other hand, vector subtraction of the voltage VR1 from the voltage VC1 gives the divided output Eo'. With reference to the voltage VC1 on the non-inverting input terminal of the operational amplifier 12, both input voltage Ei and divided output Eo' are obtained by vector summation of the same voltage VR1 in opposite directions to each other and have equal absolute value to each other. As a result, magnitude and phase relationship between the input voltage Ei and the divided output Eo' can be represented by an isosceles triangle with the input voltage Ei and the divided output Eo' as two equal sides and twice of the voltage VR1 as the base. The amplitude of the divided output Eo' is equal to that of the input signal regardless of the frequency. The amount of phase shift is represented by φ 1 in FIG. 4.

Also, as apparent from FIG. 4, both voltages VC1 and VR1 cross at a right angle on the circumference. Theoretically the phase difference between the input voltage Ei and the voltage VC1 varies from 0° to 90° as the frequency ω varies from 0 to ∞. Since the overall phase shift φ 1 of the phase shifting circuit 10C is twice as large as the above phase shift, or varies from 0° to 180° in response to the frequency. Moreover, the phase shift φ 1 can be varied by varying the resistance R of the variable resistor 16.

Also, since the output terminal 26 of the phase shifting circuit 10C is connected to the output terminal of the operational amplifier 12, there is the following relationship between the output voltage Eo and the above mentioned divided output Eo' if the resistance R21 of the resistor 21 and the resistance R23 of the resistor 23 are sufficiently small as compared with the resistance of the resistor 20:

$$Eo=(1+R21/R23)Eo'$$

This suggests that the gain can be set to larger than 1 by adjusting R21 and R23. Additionally, the amplitude of the output voltage Eo remains constant as the frequency varies and the phase angle can be shifted as shown in FIG. 4.

Figure 5:
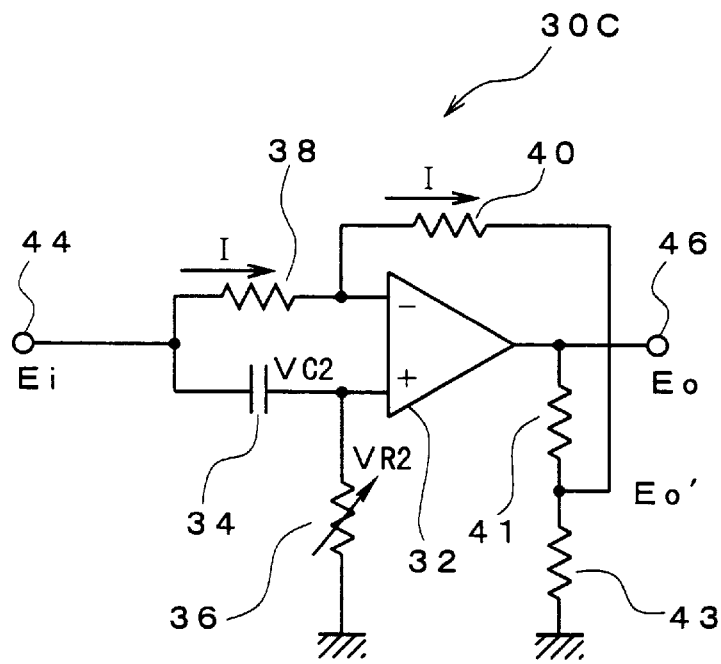
FIG. 5 is a circuit schematic of the subsequent stage phase shifting circuit in FIG. 2.

Now, illustrated in FIG. 5 is an extraction of the subsequent stage phase shifting circuit 30C in FIG. 2. The subsequent stage phase shifting circuit 30C in FIG. 5 comprises an operational amplifier 32 as a differential input amplifier, a capacitor 34 and a variable resistor 36 for shifting the phase of the input signal applied to an input terminal 44 before being applied to the non-inverting input terminal of the operational amplifier 32, a resistor 38 interposed between the input terminal 44 and the inverting input terminal of the operational amplifier 32, resistors 41, 43 defining a voltage dividing circuit to be connected to the output terminal of the operational amplifier 32 and a resistor 40 interposed between the voltage dividing circuit and the inverting input of the operational amplifier 32.

The resistors 38 and 40 in the above phase shifting circuit 30C are chosen to be equal to each other.

When an input AC signal is applied to the input terminal 44 in FIG. 5, applied to the non-inverting input terminal of the operational amplifier 32 is the voltage VR2 across the variable resistor 36. Note that there is no potential difference between the two input terminals of the operational amplifier 32, thereby equalizing the potential on the junction point of the capacitor 34 and the variable resistor 36 and the potential on the inverting input terminal of the operational amplifier 32. This means that the voltage across the resistor 38 is equal to the voltage VC2 across the capacitor 34.

Note that the same current I flows through the two resistors 38, 40 which have equal resistance to each other as mentioned above, thereby developing the voltage VC2 across the resistor 40. Since the voltage VC2 across the two resistors 38, 40 have the same vector. With reference to the inverting input terminal (voltage VR2) of the operational amplifier 32, vector summation of the voltage VC2 across the resistor 38 provides the input voltage Ei while vector subtraction of the voltage VC2 across the resistor 40 provides the voltage (divided output) Eo' on the junction of the resistors 41, 43.

Again, the output voltage Eo of the phase shifting circuit 30C is derived from the output terminal 46 of the operational amplifier 32 rather than through the voltage dividing circuit comprising the resistors 41, 43.

Figure 6:
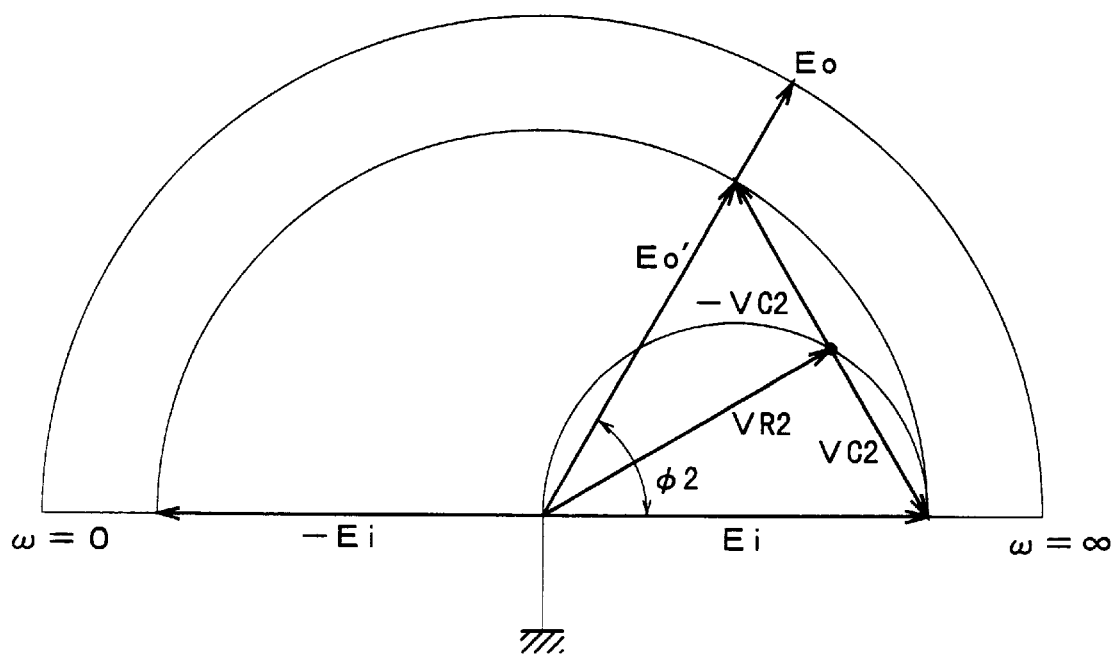
FIG. 6 is a vector diagram showing the relationship between the input and output voltages and the voltage across the capacitor and the like in the phase shifting circuit as shown in FIG. 5.

FIG. 6 is a vector diagram showing the relationship between the input and output voltages and the voltage across the capacitor in the subsequent stage phase shifting circuit 30C.

As shown in FIG. 6, the voltage VR2 across the variable resistor 36 is 90° out of phase with respect to the voltage VC2 across the capacitor 34. Vector summation of these voltage VR2, VC2 provides the input voltage Ei. As a result, when the frequency is varied while the input signal amplitude remains constant, the voltage VR2 across the variable resistor 36 and the voltage VC2 across the capacitor 34 vary along the circumference of the semi-circle as shown in FIG. 6.

On the other hand, vector subtraction of the voltage VC2 from the voltage VR2 provides the divided output Eo'. With reference to the voltage VR2 to be applied to the non-inverting input terminal, the input voltage Ei and the divided output Eo' are different from each other only in the polarity of vector combination of the voltage VC2 and thus are equal in absolute value. As a result, the relationship in magnitude and phase relationship of the input voltage Ei and the divided output Eo' can be represented by an isosceles triangle with the input voltage Ei and the divided output Eo' as two equal sides and with twice of the voltage VC2 as the base. The amplitude of the divided output Eo' is equal to that of the input signal regardless of the frequency. The phase shift is represented by φ 2 as shown in FIG. 6.

Also, as apparent from FIG. 6, since the voltage VR2 and the voltage VC2 cross at right angle on the circumference, the phase difference between the input voltage Ei and the voltage VR2 varies theoretically from 90° to 0° as the frequency ω varies from 0 to ∞. The phase shift φ 2 of the entire phase shifting circuit 30C is twice as large as the above angle, thereby varies from 180° to 0° depending on the frequency. Moreover, the phase shift φ 2 can be controlled by varying the resistance R of the variable resistor 36.

Also, since the output terminal 46 of the phase shifting circuit 30C is connected to the output terminal of the operational amplifier 32, there is the following relationship between the output voltage Eo and the above mentioned divided output Eo' if the resistance R41 of the resistor 41 and the resistance R43 of the resistor 43 are sufficiently small as compared with the resistance of the resistor 40:

$$Eo=(1+R41/R43)Eo'$$

This suggests that the gain can be set to larger than 1 by adjusting R41 and R43. Additionally, the amplitude of the output voltage Eo remains constant as the frequency varies and the phase angle can be shifted as shown in FIG. 6.

In this manner, the phase shift takes place in each of the two phase shifting circuits 10C, 30C. As shown in FIGS. 4 and 6, relative phase relationship between the input and output voltages in the phase shifting circuits 10C, 30C is opposite to each other and the total phase shift of the two phase shifting circuits 10C, 30C is 360° at a certain frequency.

The output from the subsequent stage phase shifting circuit 30C is derived from the tuning amplifier section 2 at the output terminal 92. The output from the phase shifting circuit 30C is divided by the voltage dividing circuit 60 before being fed back to the input side of the front stage phase shifting circuit 10C by way of the feedback resistor 70. The feedback signal and the input signal applied by way of the input resistor 74 are added together before being applied to the front stage phase shifting circuit 10C.

As described hereinbefore, the total phase shift of the two phase shifting circuits 10C, 30C is equal to 360° at a certain frequency. If the open loop gain of the two phase shifting circuits 10C, 30C, the voltage dividing circuit 60 and the feedback resistor 70 to 1 or lower, only the aforementioned frequency component is permitted to pass, thereby achieving the intended tuning operation.

Note that derived from the output terminal 92 of the tuning amplifier section 2 is the output from the phase shifting circuit 30C before being divided by the voltage dividing circuit 60. This means that the tuning amplifier section 2 provides a gain to amplify the signal simultaneously with tuning operation.

Now, the phase angles φ1 and φ2 as shown in FIGS. 4 and 6 are given by the following expressions (1) and (2):

$$\phi 1 = \tan\{2\omega T_1/(1-\omega^2 T_1^2)\} \quad (1)$$

$$\phi 2 = -\tan\{2\omega T_2/(1-\omega^2 T_2^2)\} \quad (2)$$

where, $T_1$ and $T_2$ are time constants of the CR circuits in the phase shifting circuits 10C, 30C. "−" sign is used to represent the phase angle φ2 in FIG. 6 with respect to the phase angle φ1 in FIG. 4.

In case of, for example, $T_1=T_2(=T)$, the total phase shift of the two phase shifting circuits 10C, 30C is equal to 360° to achieve the aforementioned tuning operation when ω=1/T. At this point, φ1=90° and φ2=−90°.

Although the phase of the output voltage Eo is shown to lead the input voltage Ei in the subsequent stage phase shifting circuit 30C in FIG. 6, it is to be noted that the output signal is in fact lagging with respect to the input signal.

Illustrated in FIG. 7 are phase relationships between input and output signals to the two phase shifting circuits 10C, 30C. In the shown example, applied to the front stage phase shifting circuit 10C is the input signal having the frequency equal to the tuning frequency and the time constants $T_1$, $T_2$ of the phase shifting circuits 10C, 30C are equal to each other.

As shown in FIG. 7(A), the front stage phase shifting circuit 10C provides the output signal S2 with phase shift of the φ1 (=90°) with respect to the input signal S1.

In the subsequent stage phase shifting circuit 30C as shown in FIG. 7(B), the output signal S3 is shifted by φ2 with respect to the input signal S2 (equal to the output signal from the front stage phase shifting circuit 10C). The output signal S3 appears to lead the input signal S2 by 90° but is in fact inverted and lagged by 90°, thereby lagging φ2'=270°.

As a result, in case of cascade connection of the two phase shifting circuits 10C, 30C as shown in FIG. 7(C), the overall phase shift will be 360° by summing the aforementioned φ1=90° and φ'2=270°.

Illustrated in FIG. 8 is a system diagram of the above mentioned two phase shifting circuits 10C, 30C and the voltage dividing circuit 60 replaced by the transfer function K1. A circuit having the transfer function K1 is paralleled with the feedback resistor 70 having a resistance R0 and connected to the input resistor 74 having a resistance equal to n times of R0 (=nR0). Also illustrated in FIG. 9 is a system diagram of the system in FIG. 8 converted by using the Miller's principle. The overall transfer function A of the converted system is given by the following expression (3):

$$A = Vo/Vi = K1/\{n(1-K1)+1\} \quad (3)$$

The transfer function K2 of the front stage phase shifting circuit 10C is given by the following expression (4):

$$K2 = a_1(1-T_1s)/(1+T_1s) \quad (4)$$

Where, $T_1$ is the time constant of the CR circuit defined by the variable resistor 16 and the capacitor 14 (let the resistance of the variable resistor 16 be R and the capacitance of the capacitor 14 be C, $T_1=CR$), s=jω and $a_1$ is the gain of the phase shifting circuit 10C, thereby $a_1=(1+R21/R23)>1$.

Also, the transfer function K3 of the subsequent stage phase shifting circuit 30C is given by the following expression (5):

$$K3 = -a_2(1-T_2s)/(1+T_2s) \quad (5)$$

Where, $T_2$ is the time constant of the CR circuit comprising the capacitor 34 and the variable resistor 36 ( let the capacitance of the capacitor 34 be C and the resistance of the variable resistor 36 be R, $T_2=CR$), and $a_2$ is the gain of the phase shifting circuit 30C, thereby $a_2=(1+R41/R43)>1$.

Assuming that the signal amplitude is attenuated by $1/a_1 \cdot a_2$ by way of the voltage dividing circuit 60, the overall transfer function K1 of the cascade connected circuit of the two phase shifting circuits 10C, 30C and the voltage dividing circuit 60 is given by the following expression (6):

$$K1 = -\{1+(Ts)^2-2Ts\}/\{1+(Ts)^2+2Ts\} \quad (6)$$

Note that both time constants $T_1$ and $T_2$ of the phase shifting circuits are considered to be equal to T in the above expression (6) for simplicity. A combination of the above expressions (6) and (3) leads to the following expression (7):

$$A = -\{1+(Ts)^2-2Ts\}/[(2n+1)\{1+(Ts)^2\}+2Ts] \quad (7)$$

$$= -\{1/(2n+1)\}[\{1+(Ts)^2-2Ts\}/\{1+(Ts)^2+2Ts/(2n+1)\}]$$

Figure 10:
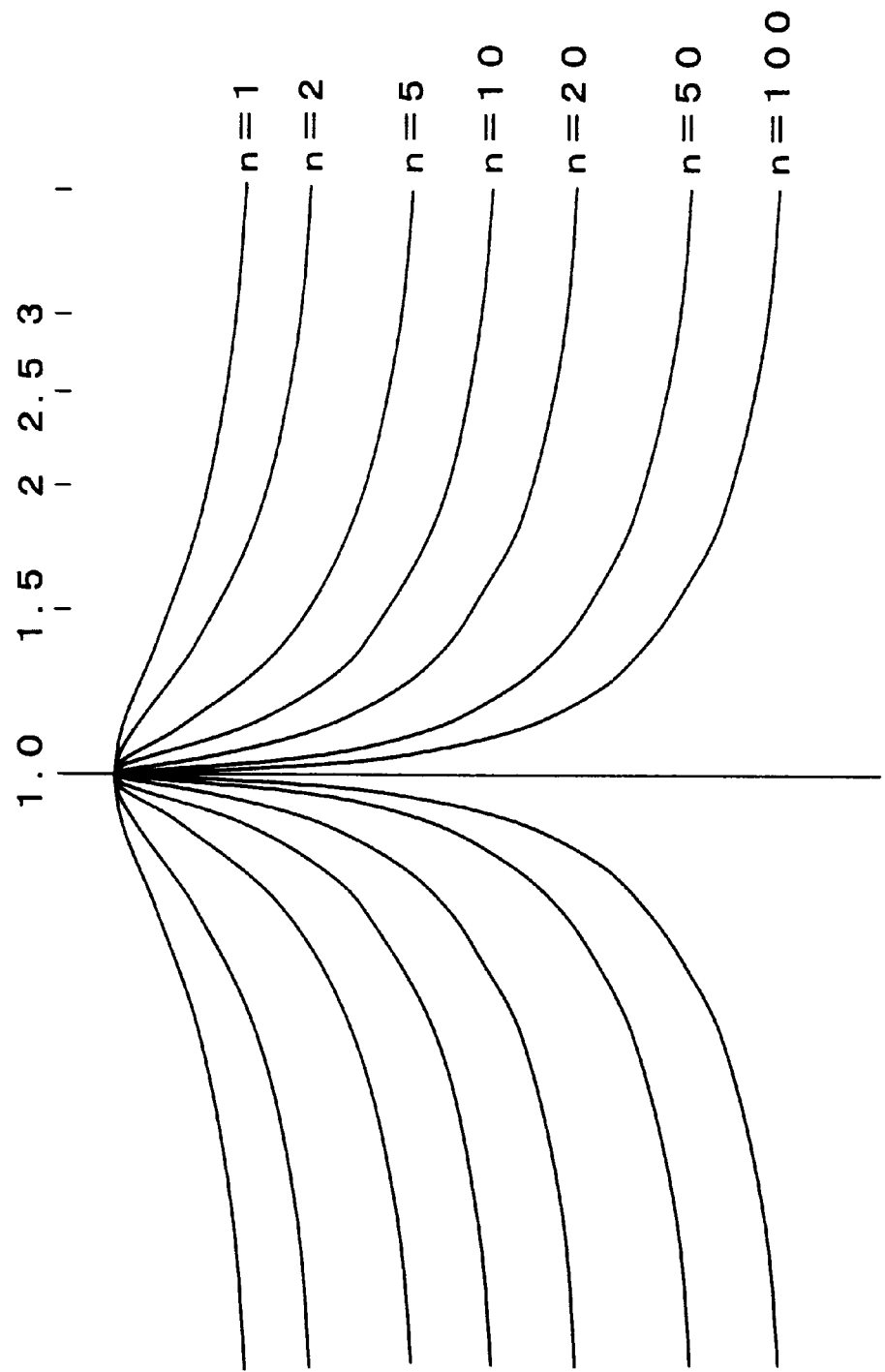
FIG. 10 is a characteristic chart of the tuning amplifier section.

According to the expression (7), the maximum attenuation A=−1/(2n+1) is achieved at ω=0 (DC domain ). Also, A=−1/(2n+1) at ω=∞. At the tuning point of ω=1/T (if the time constants of the phase shifting circuits differ, the tuning point ω=1/√($T_1 \cdot T_2$) ), A=1 independent of the resistance ratio n of the feedback resistor 70 and the input resistor 74. In other words, the tuning point and the attenuation at the tuning point remain unchanged as the resistance ratio n is varied as shown in FIG. 10.

Since the maximum attenuation depends on the resistance ratio n of the feedback resistor 70 and the input resistor 74, the maximum attenuation is unaffected by the resistances of the variable resistors 16, 36 in the phase shifting circuits 10C, 30C for controlling the tuning frequency, thereby enabling to adjust the tuning frequency and the maximum attenuation without interference therebetween.

Also, since the resistors 18, 20 in the phase shifting circuit 10C are set to equal to each other and similarly the resistors 38, 40 in the phase shifting circuit 30C equal to each other, it is possible to obtain the tuned output of substantially constant amplitude by preventing the amplitude from fluctuating when the tuning frequency in each tuning amplifier section is varied.

Particularly important is the fact that the resistance ratio n can be increased to increase the quality factor Q of the tuning amplifier section 2 while suppressing amplitude fluctuation in the tuned output. In other words, if there is frequency dependency in the open loop gain, even choosing a large resistance ratio n does not help to increase Q in lower gain frequencies and there is a possibility of increasing the open loop gain greater than 1 to cause oscillation in higher gain frequencies. As a result, the resistance ratio n cannot be set too high to prevent such oscillation in high amplitude fluctuation, thereby requiring to set the Q in the tuning amplifier section 2 to relatively low. Alternatively, the amplitude fluctuation in the tuned output from the tuning amplifier section 2 can be suppressed by connecting the voltage dividing circuits in the phase shifting circuits 10C, 30C, thereby making it possible to set the resistance ratio n high and the quality factor Q of the tuning amplifier section 2 high.

Since the tuning circuit 1 as shown in FIG. 1 comprises the aforementioned two tuning amplifier sections 2, 3 connected in a cascade manner, the tuning frequencies of the two tuning amplifier sections can be set to equal to each other or can be shifted by a certain frequency.

Figure 11:
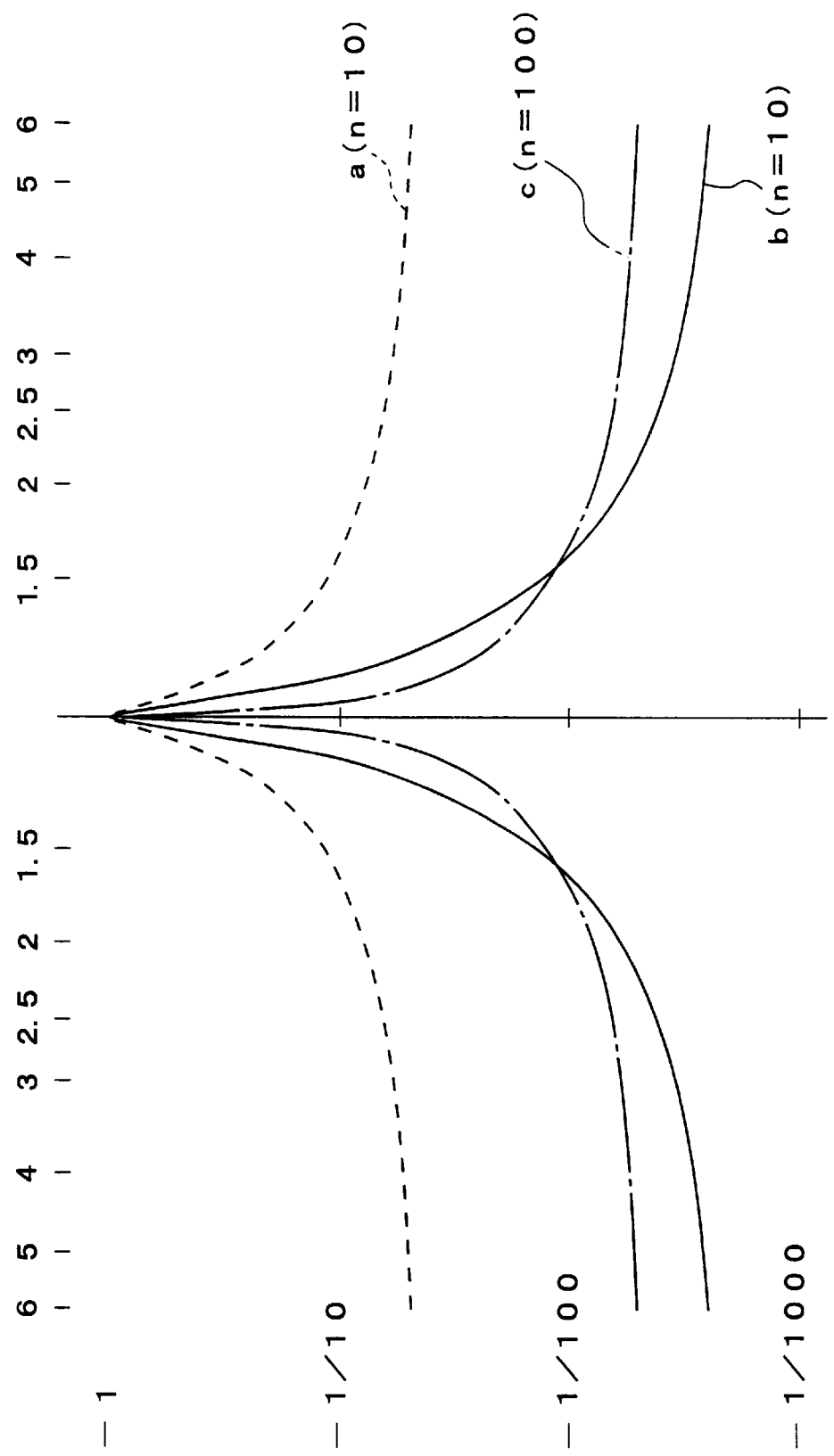
FIG. 11 is an overall characteristic chart of the tuning circuit comprising two tuning amplifier sections of identical tuning frequency to each other.

Illustrated in FIG. 11 are characteristic curves of the tuning circuit 1 including two cascade connected tuning amplifier sections set to equal tuning frequency. The characteristic curve a (dotted line) is for the first or second tuning amplifier section 2, 3 with the resistance ratio n equal to "10". The characteristic curve b (solid line) is for the overall tuning circuit 1 of the present embodiment including the cascade connected tuning amplifier sections 2, 3. For reference, represented by the characteristic curve c (single chain line) is a tuning characteristic of a single tuning amplifier section 2 (or 3) to have substantially similar maximum attenuation as the tuning circuit 1 according to the present embodiment. Apparently, the tuning frequency bandwidth is narrower than that of the tuning circuit 1 according to the present embodiment.

As apparent from comparison between FIGS. 10 and 11, a cascade connection of two tuning amplifier sections 2, 3 with relatively small resistance ratio n between the feedback resistor 70 and the input resistor 74 to provide lower maximum attenuation will provide larger maximum attenuation and wider tuning frequency bandwidth as a whole.

Particularly, according to the tuning characteristic in FIG. 11, the tuning frequency bandwidth with the maximum attenuation of each tuning amplifier section 2, 3 set to about ½ is considerably wider than twice. Accordingly, in the present embodiment including two tuning amplifier sections with their maximum attenuation set to about ½, it is possible to obtain a tuning circuit 1 having wider frequency bandwidth while maintaining the maximum attenuation unchanged. It is to be noted here that the maximum attenuation of each tuning amplifier section can be set to about ½ equally or different resistance ratio n may be set to provide different attenuations so that the overall attenuation will be the intended value.

Although two tuning amplifier sections 2, 3 are cascade connected in the aforementioned tuning circuit 1, more than two tuning amplifier sections of substantially equal tuning frequency can be connected in a cascade manner. In such example, the maximum attenuation of each tuning amplifier section can be lower and the tuning frequency bandwidth can be broader to obtain an overall tuning circuit having wider tuning frequency bandwidth by combining these characteristic curves.

Although the tuning frequency of the two tuning amplifier sections 2, 3 are equalized in FIG. 11, tuning frequencies of the tuning amplifier sections 2, 3 may be shifted each other by a given frequency. In such example cascade connection of two relatively low maximum attenuation, wider tuning frequency bandwidth tuning amplifier sections 2, 3 helps to provide a targeted maximum attenuation and wider tuning frequency bandwidth as a whole. In particular, unlike conventional staggered tuning amplifier circuit, each tuning amplifier section 2, 3 has a wider tuning frequency bandwidth, thereby enabling to minimize the number of cascade connected tuning amplifier sections.

Figure 12:
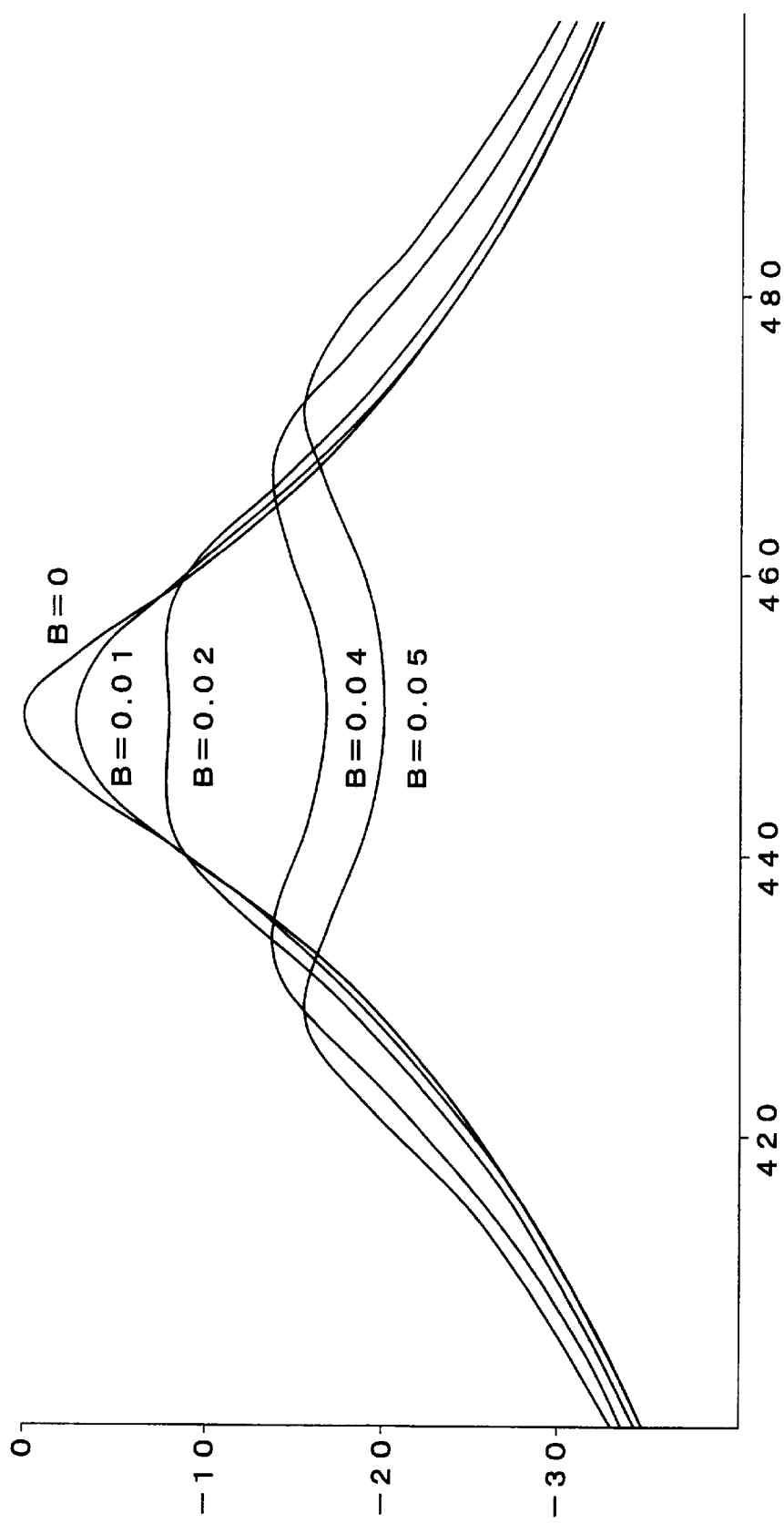
FIG. 12 is a characteristic chart of the tuning circuit comprising two tuning amplifier sections of different tuning frequencies.

Now, illustrated in FIG. 12 are characteristic curves of the tuning circuit 1 comprising two cascade connected tuning amplifier sections having shifted tuning frequencies from each other. In one example, the tuning frequency of the tuning amplifier section 2 is shifted slightly lower than the center frequency of 450 kHz while that of the tuning amplifier section 3 is shifted slightly higher than 450 kHz. In FIG. 12, represented by the vertical axis is attenuation (dB) and the horizontal axis is input signal frequency. Also represented by B is the difference from the center frequency (450 kHz). For example, B=0 means that the tuning frequencies of the two tuning amplifier sections 2, 3 are equal to the center frequency while B=0.02 means that the tuning frequency of the tuning amplifier section 2 is 2% lower than 450 kHz and that of the tuning amplifier section 3 is 2% higher than 450 kHz.

As apparent from FIG. 12, the attenuation characteristic curve near the tuning point is generally flat when the tuning frequencies of the two tuning amplifier sections 2, 3 are shifted by predetermined amount. Also, the frequency bandwidth can be set to desired value by adjusting the amount of shift, thereby increasing or decreasing the flat area. It is to be noted, however, that shifting the tuning frequencies of the two tuning amplifier sections 2, 3 causes attenuation near the tuning frequency, thereby attenuating the signal amplitude. In such a case, an amplifier may be connected at the subsequent stage to the tuning circuit 1 in order to compensate for the attenuated signal amplitude.

Figure 13:
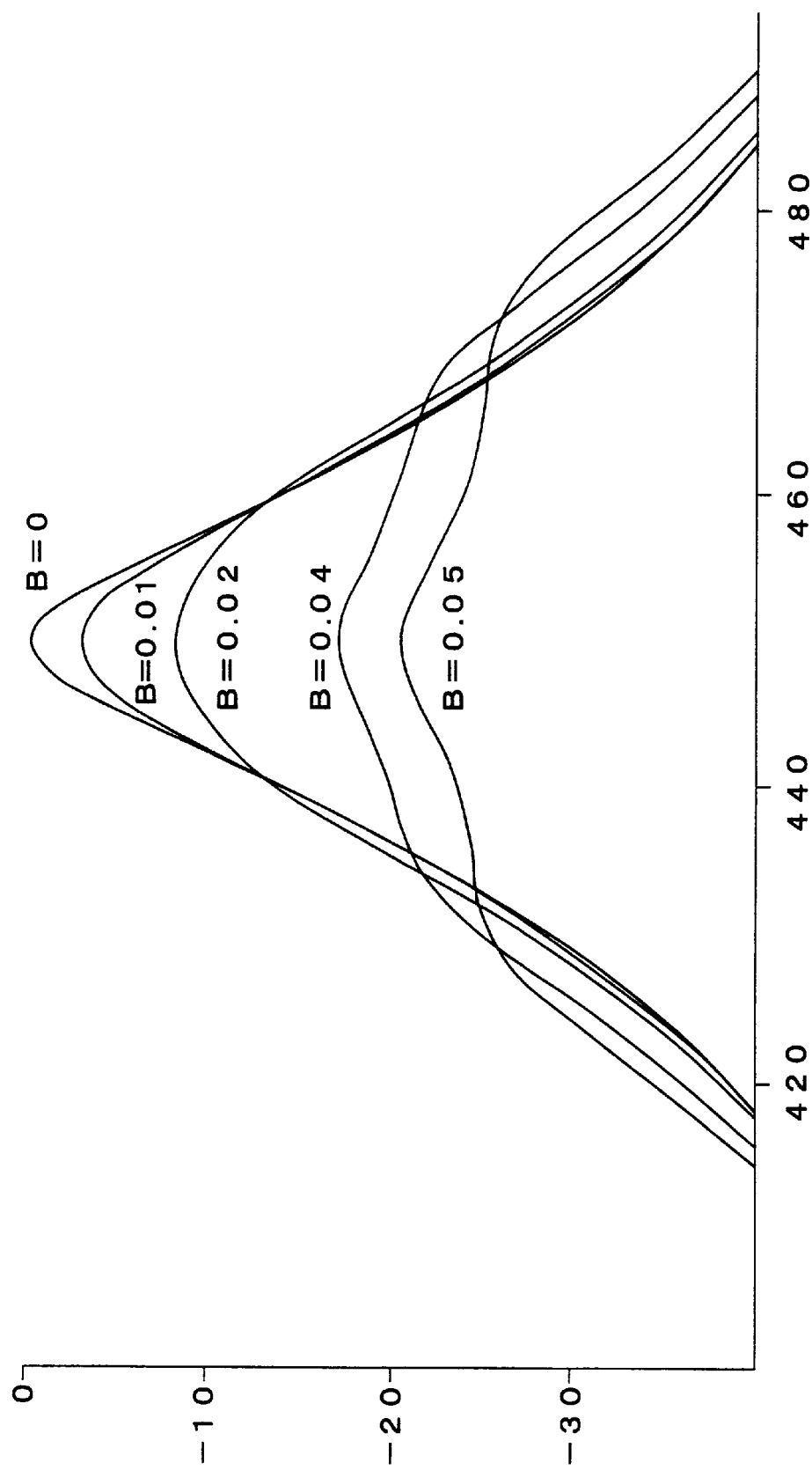
FIG. 13 is a characteristic chart of the tuning circuit comprising three tuning amplifier sections of different tuning frequencies from one another.

Illustrated in FIG. 13 are characteristic curves of the tuning circuit having three cascade connected tuning amplifier sections. In one example, the tuning frequency of the third stage tuning amplifier section is set to 450 kHz, that of the first stage tuning amplifier section is set to slightly lower than 450 kHz, and that of the second stage tuning amplifier section is set to slightly higher than 450 kHz.

As apparent from FIG. 12, in case of the tuning circuit comprising two cascade connected tuning amplifier sections, there is an increasing amount of attenuation near the center frequency as the tuning frequency difference of the two tuning amplifier sections increases. On the contrary, in a tuning amplifier section comprising three cascade connected tuning amplifier sections as shown FIG. 13, there causes less attenuation near the center frequency. It is therefore advantageous to cascade connect three or more tuning amplifier sections in order to secure a wider frequency bandwidth.

As understood from the foregoing description, the frequency bandwidth can be set wider by cascade connecting two or more tuning amplifier sections with their tuning frequencies identical to or shifted from each other, thereby enabling to apply to television tuners, etc. It is to be noted that a trap circuit may be incorporated with the tuning circuit 1, if necessary, in order to apply it to television tuners, etc.

Since the tuning frequency can be easily adjusted by controlling the resistance of the variable resistors 16, 36 in the phase shifting circuits 10C, 30C of two (or more) tuning amplifier sections 2, 3 constituting the tuning circuit 1, it is easy to achieve a variable frequency tuning circuit 1.

It is also noted that the tuning amplifier sections 2, 3 constituting the tuning circuit 1 can be constructed by a combination of differential amplifiers, capacitors and resistors which can be fabricated on a semiconductor substrate.

This suggests that the entire circuit of the tuning circuit 1 can be easily fabricated on a semiconductor substrate as an integrated circuit.

Although two or more tuning amplifier sections are directly connected without any intervening element in the present embodiment, it is appreciated that a buffer circuit may be interposed between adjacent tuning amplifier sections in order to prevent interference. Alternatively, an amplifier may be interposed between adjacent tuning amplifier sections. Interposing such amplifier may help to make the characteristic curves, for example, in FIG. 13 more flat near the tuning point.

Although the tuning amplifier section 2 (or 3) in FIG. 2 includes CR circuits in the phase shifting circuits 10C, 30C, such CR circuits may be replaced by LR circuits each comprising a resistor and an inductor.

Figure 14:
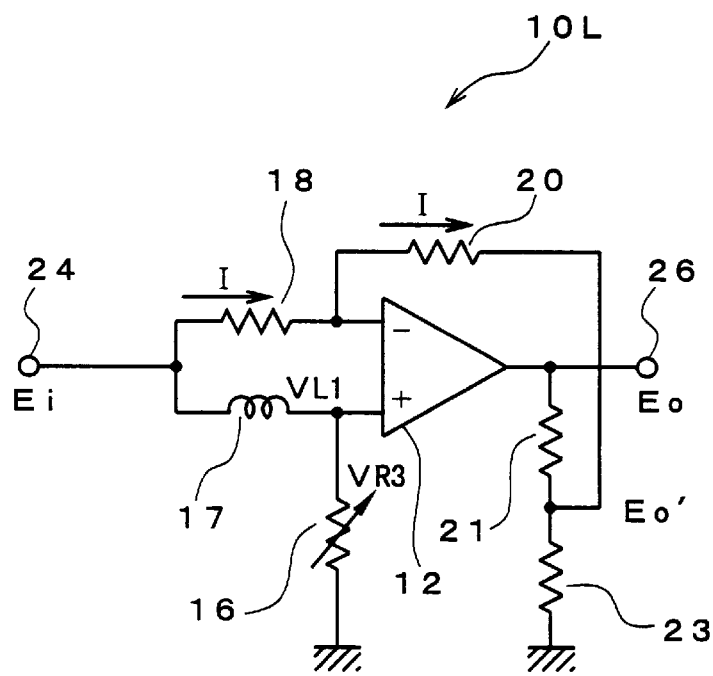
FIG. 14 is a circuit schematic of a phase shifting circuit to be replaced for the phase shifting circuit in FIG. 3.

Illustrated in FIG. 14 is a circuit schematic of a phase shifting circuit including an LR circuit, which can be replaced for the front stage phase shifting circuit 10C in the tuning amplifier section 2 as shown in FIG. 2. The phase shifting circuit 10L as shown in FIG. 14 is derived from the phase shifting circuit 10C in FIG. 3 by replacing the CR circuit of the capacitor 14 and the variable resistor 16 by the LR circuit of a variable resistor 16 and an inductor 17.

Figure 15:
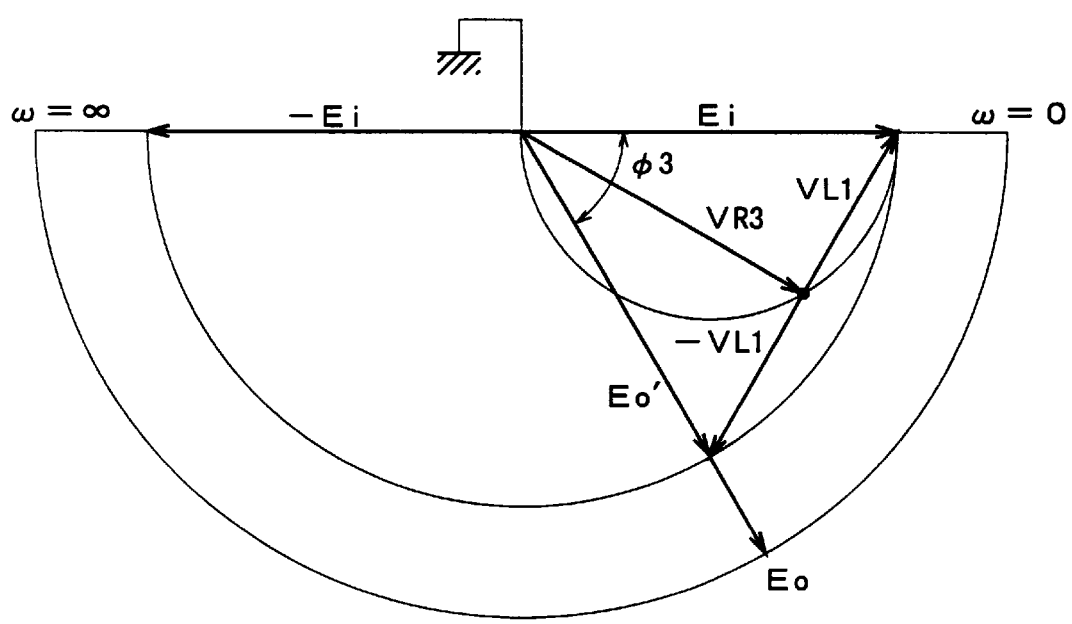
FIG. 15 is a vector diagram showing the relationship between the input and output voltages and the voltage across the inductor and the like in the phase shifting circuit in FIG. 14.

Illustrated in FIG. 15 is a vector diagram showing the relationship between the input and output voltages of the phase shifting circuit 10L and the voltage across the inductor. As shown in FIG. 15, the voltage VR3 across the variable resistor 16 and the voltage VL1 across the inductor 17 are 90° phase shifted with each other. Vector summation of VR3 and VL1 is the input voltage Ei. As a result, in case of the input signal of constant amplitude and variable in frequency, the voltage VR3 across the variable resistor 16 and the voltage VL1 across the inductor 17 more along the semi-circle as shown in FIG. 15.

On the other hand, vector subtraction of VL1 from VR3 is the divided output Eo'. With reference to the voltage VR3 to be applied to the non-inverting input terminal of the operational amplifier 12, the input voltage Ei and the divided output Eo' differ only in the direction of combining the voltage VL1 and have equal absolute value. As a result, the magnitude and phase relationship of the input voltage Ei and the divided output Eo' can be represented by an isosceles triangle with the both input voltage Ei and the divided output Eo' as the two equal sides and twice of the voltage VL1 as the base. The amplitude of the divided output Eo' is equal to the amplitude of the input signal regardless of the frequency and the phase shift can be represented by φ 3 in FIG. 15.

Also, as apparent from FIG. 15, the voltage VR3 and VL1 cross at right angle on the circle, thereby theoretically providing from 0° to 90° phase angle between the input voltage Ei and the voltage VR3 as the frequency ω varies from 0 to ∞. Since the overall phase shift φ 3 of the phase shifting circuit 10L is twice as large as the above and varies from 0° to 180° in response to the frequency.

The output terminal 26 of the phase shifting circuit 10L is connected to the output terminal of the operational amplifier 12. As a result, the relationship between the output voltage Eo and the divided output Eo' is Eo=(1+R21/R23) Eo', where R21 and R23 represent resistances of the resistors 21 and 23, respectively. This means that the gain can be set to greater than 1 by adjusting R21 and R23. The amplitude of the output voltage Eo remains constant and only phase changes when frequency varies as shown in FIG. 15.

Incidentally, the transfer function of the phase shifting circuit 10L as shown in FIG. 14 is the same as K2 in the above expression (4), wherein the time constant $T_1$ of the LR circuit comprising the inductor 17 and the variable resistor 16 is equal to L/R (i.e., $T_1$=L/R). L and R represent the inductance of the inductor 17, and the resistance of the variable resistor 16, respectively. Also, the phase shift φ 3 is the same as φ 1 given by the above expression (1) if the above time constant $T_1$ is used.

Figure 16:
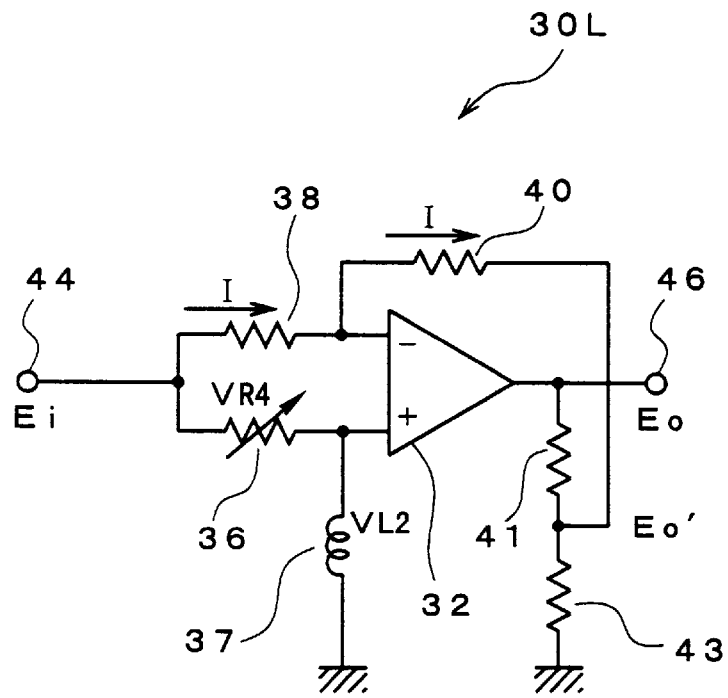
FIG. 16 is a circuit schematic of a phase shifting circuit capable of replacing the phase shifting circuit in FIG. 5.

Now, illustrated in FIG. 16 is a circuit schematic of another example of a phase shifting circuit including an LR circuit, which can be replaced for the subsequent stage phase shifting circuit 30C in the tuning amplifier section 2 in FIG. 2. The phase shifting circuit 30L in FIG. 16 is equal to the phase shifting circuit 30C in FIG. 5 if the CR circuit of the variable resistor 36 and the capacitor 34 is replaced by an LR circuit comprising the inductor 37 and the variable resistor 36.

Figure 17:
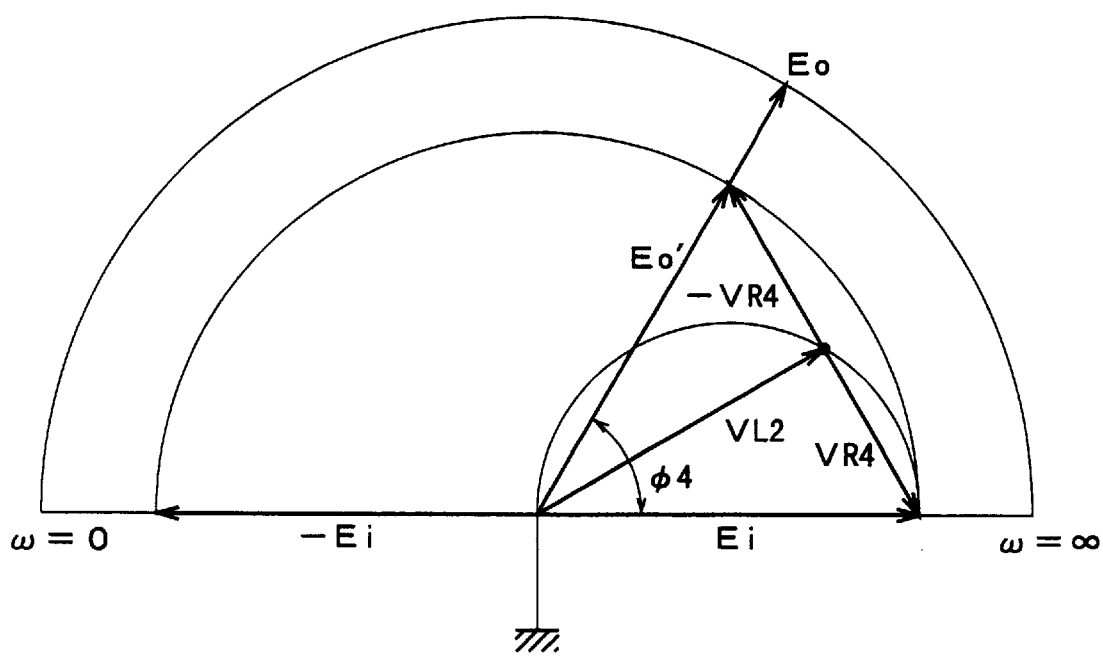
FIG. 17 is a vector diagram showing the relationship between the input and output voltages and the voltage across the inductor and the like in the phase shifting circuit as shown in FIG. 16.

Illustrated in FIG. 17 is a vector diagram showing the relationship between the input and output voltage of the phase shifting circuit 30L and the voltage across the inductor. The voltage VL2 across the inductor 37 and the voltage VR4 across the variable resistor 36 are 90° phase shifted with each other. A vector summation of VL2 and VR4 is the input voltage Ei. When the input signal frequency varies while maintaining its amplitude constant, the voltage VL2 across the inductor 37 and the voltage VR4 across the variable resistor 36 move along the semicircle.

On the other hand, the divided output Eo' is a vector subtraction of the voltage VR4 from the voltage VL2. With reference to the voltage VL2 applied to the non-inverting input terminal, the input voltage Ei and the divided output Eo' are equal in absolute value but differ in the direction of combining the voltage VR4. As a result, the amplitude and phase relationship between the input voltage Ei and the divided output Eo' can be represented by an isosceles triangle with Ei and Eo' as the two equal sides and twice of the voltage VR4 as the base. The amplitude of the divided output Eo' is the same as that of the input signal regardless of the frequency and the phase shift is represented by φ 4 in FIG. 17.

As apparent from FIG. 17, the voltages VL2 and VR4 cross at right angle on the circular circumference, therefore the phase difference between the input voltage Ei and the voltage VL2 varies theoretically from 90° to 0° as the frequency ω varies from 0 to ∞. The overall phase shift φ 4 of the phase shifting circuit 30L is twice as large as the above phase angle and varies from 180° to 0°.

Again, since the output terminal 46 of the phase shifting circuit 30L is connected to the output terminal of the operational amplifier 32, the relationship between the output voltage Eo and the divided output Eo' is Eo=(1+R41/R43) Eo', where R41 and R43 represent the resistances of the resistors 41 and 43, respectively. This suggests that adjustment of R41 and R43 will provide any gain greater than 1 and the output voltage Eo remains constant while phase is shifted by predetermined amount as the frequency varies as illustrated in FIG. 17.

Incidentally, the transfer function of the phase shifting circuit 30L in FIG. 16 is given by the K3 in the expression (5) and the phase shift φ 4 is the same as φ 2 given by the above expression (2) if the time constant $T_2$ of the LR circuit comprising the variable resistor 36 and the inductor 37 is L/R (i.e., $T_2$ =L/R, where R and L represent the resistance of the variable resistor 36 and the inductance of the inductor L, respectively).

As understood from the foregoing description, the phase shifting circuits 10L and 30L as shown in FIGS. 14 and 16 are equivalent to the phase shifting circuits 10C and 30C as shown in FIGS. 3 and 5, respectively. It is therefore possible to replace the front stage phase shifting circuit 10C and the subsequent stage phase shifting circuit 30C of the tuning amplifier section 2 can be replaced by the phase shifting circuits 10L and 30L as shown in FIGS. 14 and 16, respectively.

Now, the tuning frequency of the two phase shifting circuits 10L, 30L is determined by the time constants of the LR circuits included in the phase shifting circuits 10L and 30L. The time constant is for example L/R and the tuning frequency ω of the tuning amplifier section including the two phase shifting circuits 10L, 30L is proportional to 1/T=R/L. It is to be noted, here, that the inductor comprising the LR circuit can be formed on a semiconductor substrate by a spiral conductor made by photoetching or other technology. The use of such particular inductor makes it possible to fabricate the entire tuning amplifier section on a semiconductor substrate as an integrated circuit.

However, since the inductance of such inductor is fairly small, the tuning frequency becomes high. In other words, the tuning frequency of the tuning amplifier section is proportional to the inverse R/L of the time constant of the LR circuits in, for example, the phase shifting circuits 10L, 30L. The inductance L can be small by integrated circuit technology, thereby enabling to choose a high tuning frequency by forming the entire tuning amplifier section including the two phase shifting circuits 10L, 30L in an integrated circuit.

It is also possible in the tuning amplifier section 2 as shown in FIG. 2 to replace either one of the phase shifting circuits 10C, 30C by the phase shifting circuit 10L or 30L as shown in FIG. 14 or 16. In particular, integrating such tuning amplifier section is effective for preventing the tuning frequency from varying due to temperature changes, thereby providing temperature compensation. More in detail, the time constant T of a CR circuit is equal to CR while that of an LR circuit is equal to L /R. The resistance R are in the numerator and denominator, respectively. In case of forming the resistors for the CR and LR circuits by using the semiconductor material by integrated circuit technology, the tuning frequency fluctuation due to temperature characteristic of such resistors is effectively restricted.

In the tuning amplifier section in FIG. 2, connected to the subsequent stage of the two phase shifting circuits 10C, 30C is the voltage dividing circuit 60 for feeding back the output from the voltage dividing circuit 60 by way of the feedback resistor 70, thereby setting the overall gain of the tuning amplifier section greater than 1. By setting the dividing ratio of the voltage dividing circuit 60 to 1 or removing the voltage dividing circuit 60, the overall gain of the tuning amplifier section may be set to 1.

Figure 18:
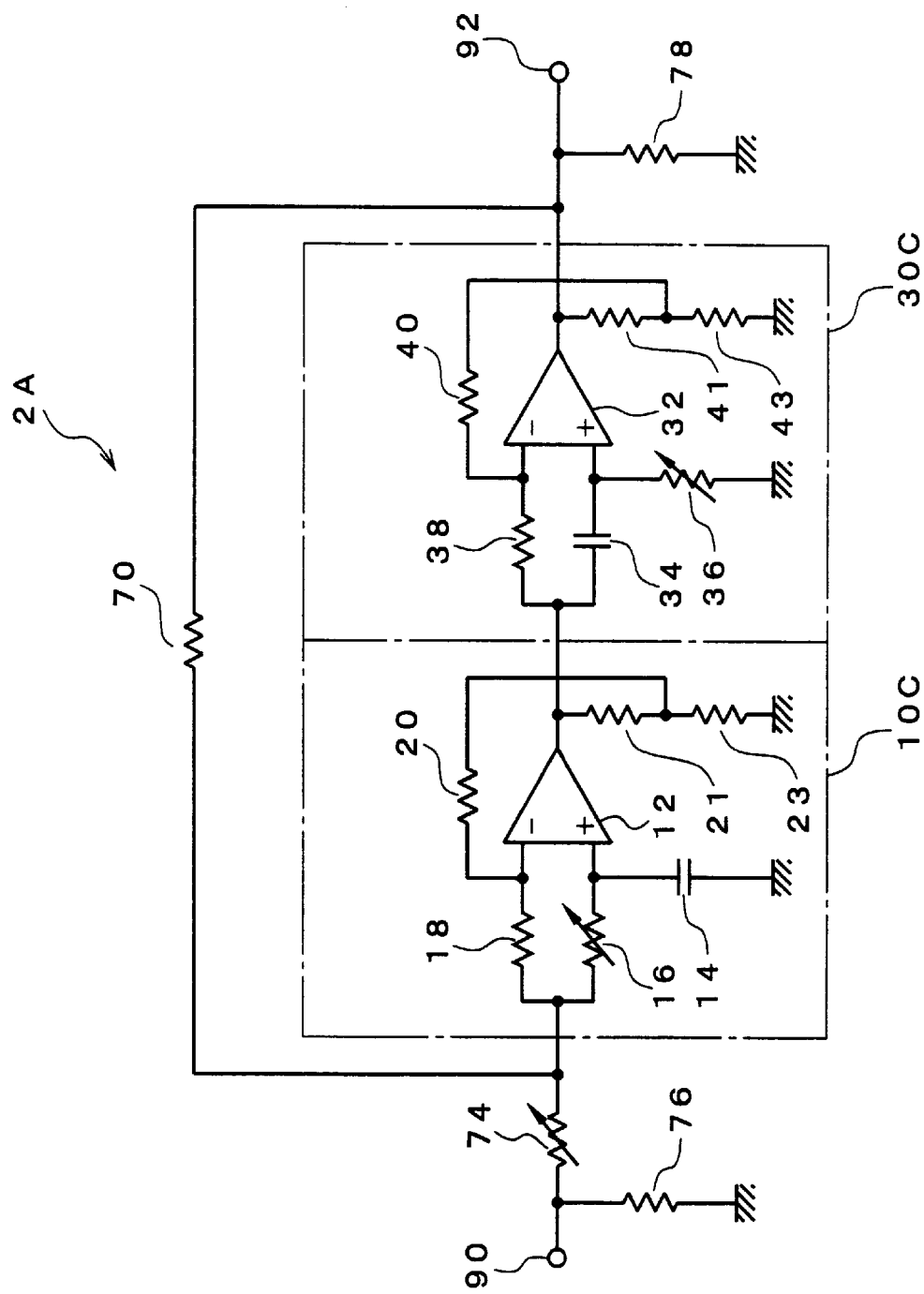
FIG. 18 is a circuit schematic of an alternative tuning amplifier section.

Illustrated in FIG. 18 is a circuit schematic of the tuning amplifier section with the voltage dividing circuit interposed between the subsequent stage phase shifting circuit and the output terminal 92 eliminated. The tuning amplifier section 2A in FIG. 18 is equal to the tuning amplifier section 2 in FIG. 2 with the dividing ratio of the voltage dividing circuit 60 set to 1. In other words, the two dividing resistors in the voltage dividing circuit 60 in FIG. 2 are replaced by a single resistor 78 in FIG. 18.

The tuning amplifier section 2A as constructed above excludes the voltage dividing circuit 60 as shown in FIG. 2 and the gain of each of the phase shifting circuits 10C, 30C is set to greater than 1 in order to compensate for the loss in the open loop including the phase shifting circuits 10C, 30C.

Note that, in the tuning amplifier sections 2, 2A as shown in FIGS. 2 and 18, the voltage dividing circuit comprising the resistors 21,23 or 41,43 is connected to set the gain of each of the phase shifting circuits 10C, 30C greater than 1, thereby compensating for loss in the open loop gain. However, only one of the two phase shifting circuits 10C, 30C is set to have a gain greater than 1 while the other gain set to 1. In order to set the gain of the phase shifting circuit 10C, the voltage dividing circuit comprising the resistors 21, 23 is removed and the output from the operational amplifier 12 is directly fed back by way of the resistor 20. Similarly, the gain of the phase shifting circuit 30C can be set to 1 by removing the voltage dividing circuit comprising the resistors 41, 43 and directly feeding back the output from the operational amplifier 32.

Loss of the open loop gain of the feedback loop including the phase shifting circuits 10C, 30C and the feedback resistor 70 is caused by the input impedance of the front stage phase shifting circuit 10C. In order to reduce the loss due to the input impedance, a follower circuit using a transistor may be interposed at the preceding stage of the front stage phase shifting circuit 10C so that the feedback signal is applied to the front stage phase shifting circuit 10C by way of the follower circuit.

However, it is to be noted that a certain gain loss is caused by the follower circuit even if it may avoid the loss of the open loop gain. In order to compensate for the loss by follower circuit, it is necessary to make either one of the phase shifting circuits 10C, 30C has more than 1 gain similar to the above mentioned embodiment.

Figure 19:
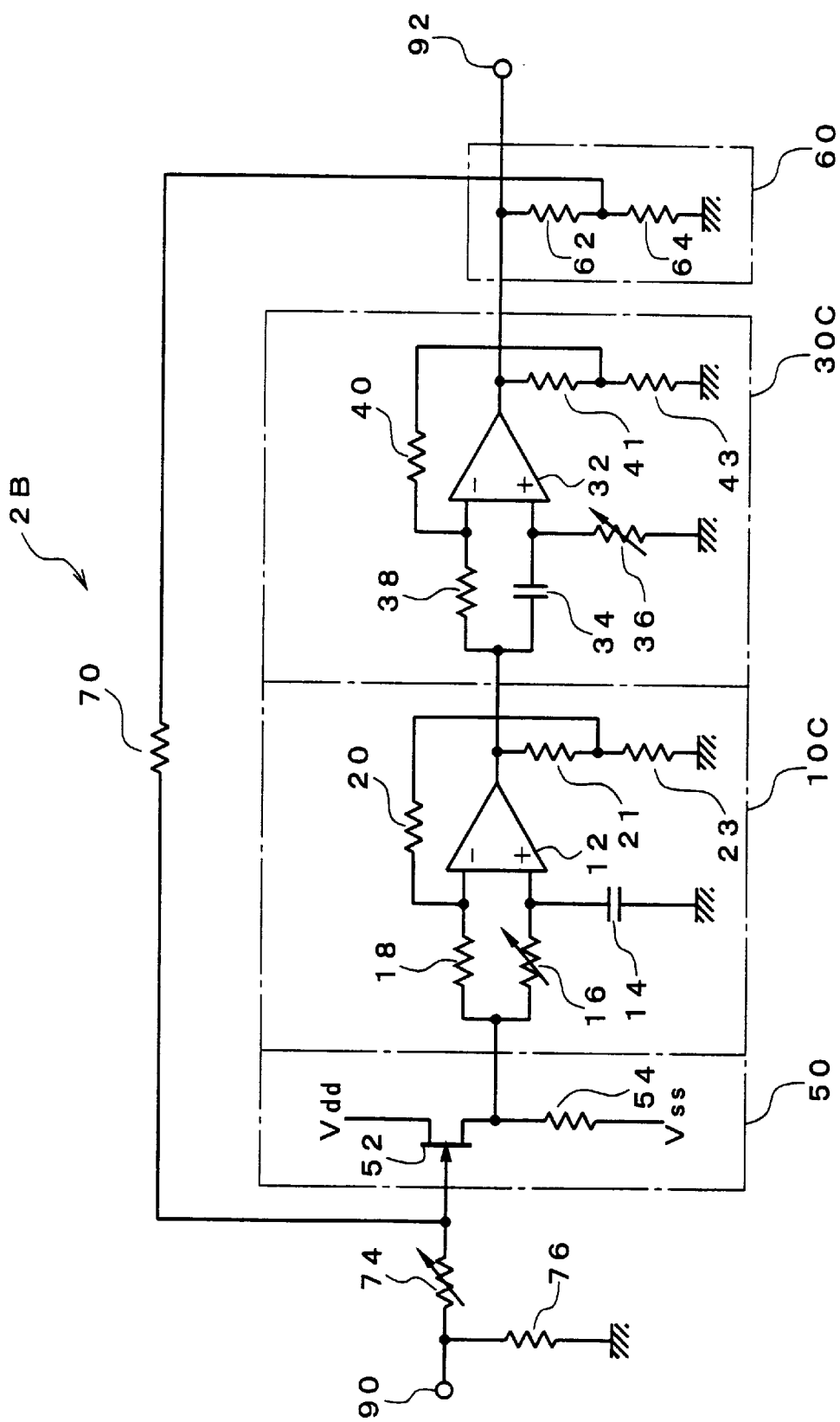
FIG. 19 is a circuit schematic of still another tuning amplifier section.

Now, illustrated in FIG. 19 is a circuit schematic of a tuning amplifier section 2B having an additional source follower circuit.

The source follower circuit 50 interposed at the input side of the front stage phase shifting circuit 10C includes an FET (field effect transistor) 52 having the drain connected to a positive power supply Vdd, and the source returned to a negative power supply Vss by way of a source resistor 54. The source follower circuit is constituted by the FET 52 and the resistor 54 and the output from the source follower circuit is fed to the front stage phase shifting circuit 10C. It is to be note that the source follower circuit may be replaced by an emitter follower circuit. (Second Embodiment of the Tuning Amplifier Section)

Figure 20:
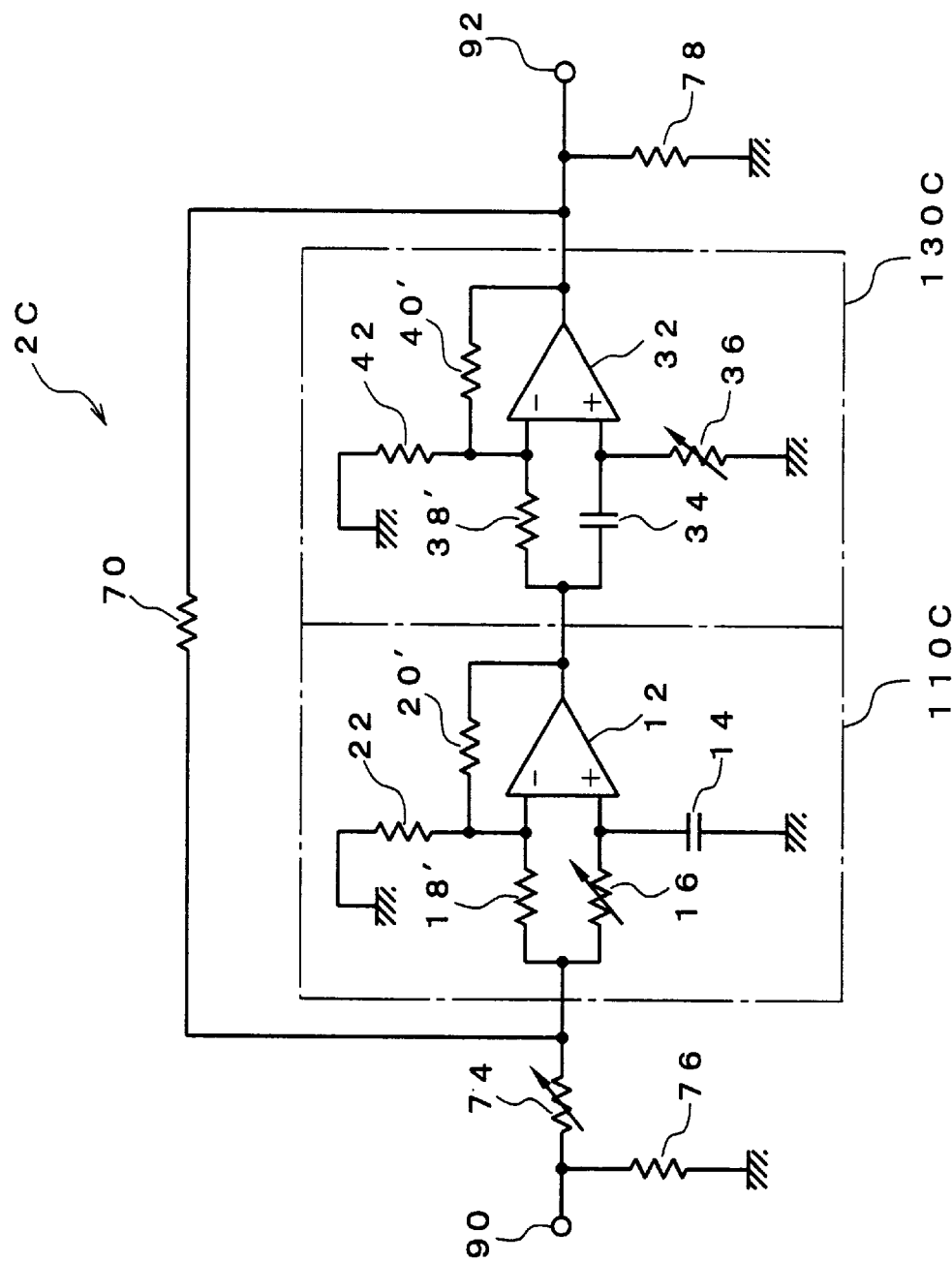
FIG. 20 is a circuit schematic of yet another tuning amplifier section.

Now, illustrated in FIG. 20 is a circuit schematic of an alternative embodiment of the tuning amplifier section. The tuning amplifier section 2C as shown in FIG. 20 comprises two phase shifting circuits 110C, 130C to provide a total of 360° phase shift of an input AC signal at a predetermined frequency and an adding circuit to add with a predetermined ratio the input signal applied to an input terminal 90 to which an input resistor 74 is connected and a signal (feedback signal) to be fed back from the output of the subsequent stage phase shifting circuit 130C by way of a feedback resistor 70. (Note that the resistance of the input resistor 74 is n times of that of the feedback resistor 70.)

In the tuning amplifier sections 2, 2A, 2B as shown in FIG. 2, etc., the resistances of the resistors 18, 20 in the front stage phase shifting circuit 10C are set equal to each other, thereby maintaining the output amplitude unchanged when the frequency of the input AC signal varies. Also, the voltage dividing circuit comprising the resistors 21, 23 connected to the output of the phase shifting circuit 10C sets the gain greater than 1. On the contrary, the front stage phase shifting circuit 110C included in the tuning amplifier section 2C in FIG. 20 does not employ the voltage dividing circuit comprising the resistors 21, 23 and the gain of the phase shifting circuit 110C is set greater than 1 by choosing the resistance of the resistor 20' larger than that of the resistor 18'.

The same is true about the subsequent stage phase shifting circuit 130C and the gain is set greater than 1 by choosing the resistance of the resistor 40' larger than that of the resistor 38'.

By setting the gain of the two phase shifting circuits 110C, 130C in FIG. 20 greater than 1, loss of the open loop gain of the feedback loop in the tuning amplifier section 2C can be compensated, thereby performing the same tuning operation as the tuning amplifier sections 2 and the like as shown in FIG. 2 and the like.

In case of setting the gain of each phase shifting circuit greater than 1, the gain tends to vary depending on the input signal frequency. Taking the front stage phase shifting circuit 110C as an example, the phase shifting circuit 110C acts as a voltage follower with a unity (1) gain in low input signal frequencies. In high frequencies, however, the phase shifting circuit 110C acts as an inverter amplifier with the gain of −m (m represents the resistance ratio between the resistors 20' and 18'), the gain of the phase shifting circuit 110C and thus the output signal amplitude tend to vary depending on the input signal frequency.

Such amplitude variation may be suppressed by connecting a resistor 22 to the inverting input terminal of the operational amplifier 12 by equalizing the gains in low and high input signal frequencies. Similarly, in the phase shifting circuit 130C, a resistor 42 having a predetermined resistance is connected to the inverting input terminal of the operational amplifier 32, thereby suppressing the output signal amplitude variation.

Figure 21:
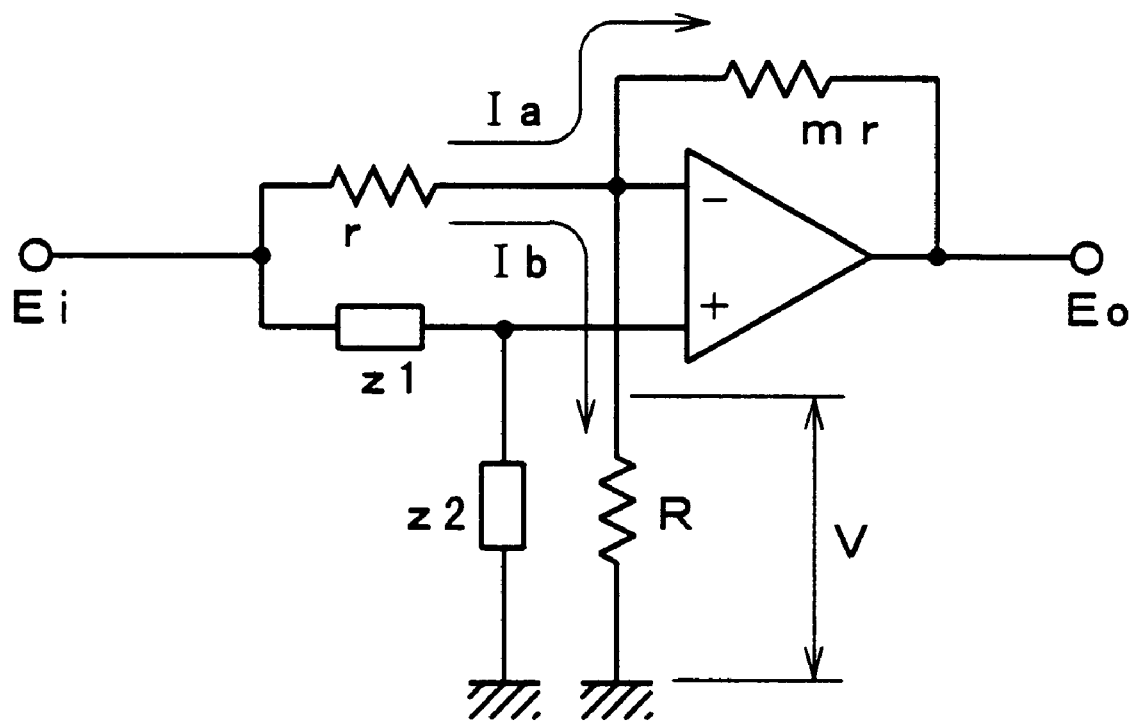
FIG. 21 is a generalized circuit schematic of the phase shifting circuits in the tuning amplifier section as shown in FIG. 20.

Then, proper setting of the resistance of the resistor 22 (or resistor 42) will be studied. Illustrated in FIG. 21 is a generalized circuit schematic of the above mentioned phase shifting circuits 110C, 130C. The CR circuit included in each phase shifting circuit is represented by elements having impedances z1 and z2. As shown in FIG. 21, the resistance of the input resistor of the operational amplifier is represented by r, the resistance of the feedback resistor mr, the resistance of the resistor (22 or 42) connected to the inverting input terminal of the operational amplifier R, and the potential on the inverting input terminal of the operational amplifier V.

Then, the following relationship holds true between the input voltage Ei and the potential V:

$$r(Ia+Ib)+V=Ei \quad (8)$$

Also, the potential V can be represented as follows by using varies constants shown in FIG. 21:

$$V=Ib\,R \quad (9)$$

$$V=Eo+mr\,Ia \quad (10)$$

$$V=\{z2/(z1+z2)\}Ei=kEi \quad (11)$$

In the expression (11), the dividing ratio of the two elements having impedances z1 and z2 is represented by k.

Ia and Ib are calculated from the above expressions (10) and (9) and substituted in the expression (8) and then the result in the expression (11) to eliminate V. Then, $$Ea=(Rk+Rmk+mrk-Rm)Ei/R \quad (12)$$

Incidentally, condition when the phase shifting circuit as shown in FIG. 21 operates as an inverter amplifier is that the impedance z2 is equal to 0 Ω and k=0. Then, the expression (12) can be:

$$Eo=-mEi \quad (13)$$

Condition when the phase shifting circuit in FIG. 21 operates as a follower circuit is that the impedance z1 is equal to 0 Ω and k=1. Then, the expression (12) can be:

$$Eo=(R+mr)Ei/R \quad (14)$$

If there is no gain changes when the phase shifting circuit 110C or 130C operates as an inverting amplifier and a follower circuit, the absolute values of Eo given by the expressions (13) and (14) are equal to each other, thereby establishing the following expression (15):

$$m=(R+mr)/R \quad (15)$$

$$R=mr/(m-1) \quad (16)$$

As a result, setting the resistance R of the resistor 22 in the phase shifting circuit 110C or the resistance R of the resistor 42 in the phase shifting circuit 130C in accordance with the expression (16) helps to suppress the gain changes as the frequency is varied from low frequency to high frequency.

Although the tuning amplifier section 2C as shown in FIG. 20 is configured each of the phase shifting circuits 110C, 130C to include a CR circuit, it is possible to configure the tuning amplifier section using phase shifting circuits each including an LR circuit comprising a resistor and an inductor replacing the CR circuit.

Figure 22:
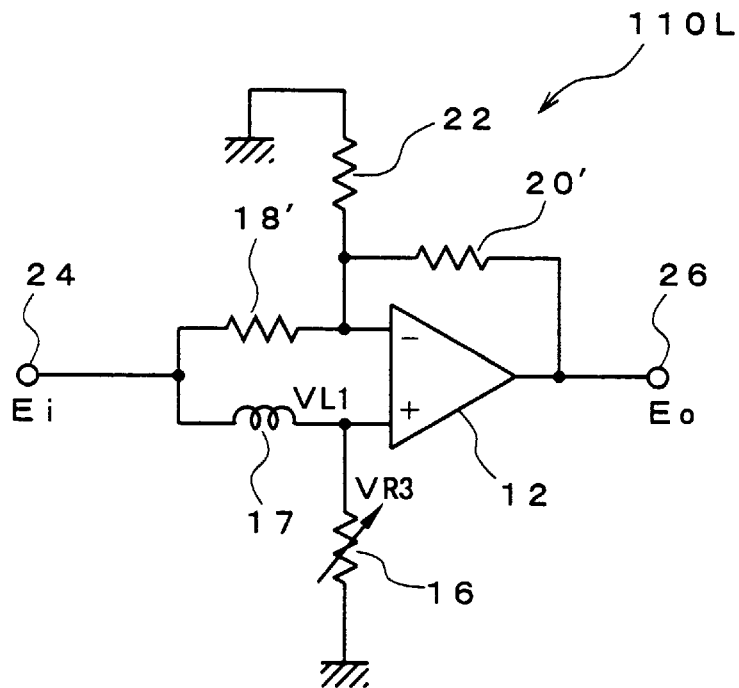
FIG. 22 is a circuit schematic of an alternative phase shifting circuit to the one in the front stage in FIG. 20.

Now, illustrated in FIG. 22 is a circuit schematic of a phase shifting circuit including such LR circuit, which can be replaced for the front stage phase shifting circuit 110C in the tuning amplifier section 2C as shown in FIG. 20. The phase shifting circuit 110L as shown in FIG. 22 is equal to the front stage phase shifting circuit 110C in FIG. 20 with the CR circuit of the capacitor 14 and the variable resistor 16 replaced by the LR circuit of a variable resistor 16 and an inductor 17.

The transfer function of the above phase shifting circuit 110L is given by K2 in the expression (4) if the time constant $T_1$ of the LR circuit comprising the inductor 17 and the variable resistor 16 is equal to L/R (i.e., $T_1=L/R$) with L and R representing the inductance of the inductor 17 and the resistance of the variable resistor 16. Consequently, the phase shift is equal to $\phi 1$ in the expression (1) if represented by the time constant $T_1$.

Figure 23:
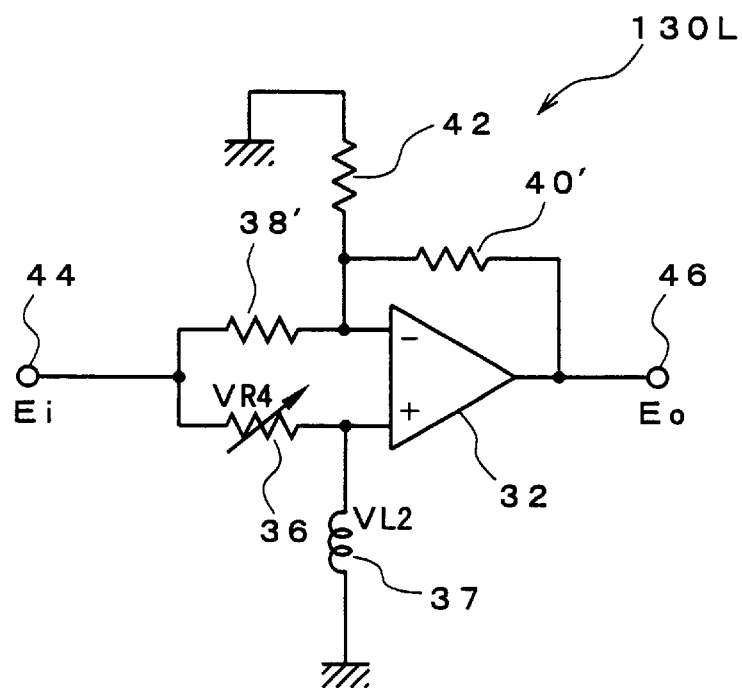
FIG. 23 is a circuit schematic of an alternative phase shifting circuit to the one in the output stage in FIG. 20.

Also, illustrated in FIG. 23 is a circuit schematic of an alternative phase shifting circuit including an LR circuit, which can be replaced for the subsequent stage phase shifting circuit 130C of the tuning amplifier section 2C as shown in FIG. 20. The phase shifting circuit 130L in FIG. 23 is equal to the subsequent stage phase shifting circuit 130C in FIG. 20 with the CR circuit comprising the variable resistor 36 and the capacitor 34 replaced by the LR circuit comprising the inductor 37 and the variable resistor 36.

The transfer function of the above mentioned phase shifting circuit 130L can be the same as K3 given by the above expression (5) if the time constant $T_2$ of the LR circuit comprising the variable resistor 36 and the inductor 37 is equal to L/R (i.e., $T_2=L/R$ where L and R are the inductance of the inductor 37 and the resistance of the variable resistor 36, respectively). As a result, the phase shift is the same as $\phi 2$ given by the above expression (2) using the above time constant $T_2$.

As apparent from the above, the phase shifting circuits 110L and 130L in FIGS. 22 and 23 are equivalent to the phase shifting circuits 110C and 130C in FIG. 20, thereby enabling to replace the front stage phase shifting circuit 110L in FIG. 22 and the subsequent phase shifting circuit 130L in FIG. 23 for the front stage phase shifting circuit 110C and the subsequent stage phase shifting circuit 130C in the tuning amplifier section 2C as shown in FIG. 20. If the two phase shifting circuits 110C and 130C are replaced by the phase shifting circuits 110L and 130L, it is easy to form the entire tuning amplifier section as an integrated circuit and to obtain higher tuning frequency.

On the other hand, if either one of the two phase shifting circuits 110C, 130C is replaced by the phase shifting circuit 110L or 130L, temperature drift of the tuning frequency may be suppressed.

Incidentally, amplitude fluctuation of the tuning amplifier section 2C as shown in FIG. 20 due to adjustment of the tuning frequency is minimized by connecting resistors 22 or 42 to the two phase shifting circuits 110C, 130C in the tuning amplifier section 2C shown in FIG. 20. However, in a case of narrow frequency variation, there is little amplitude fluctuation, thereby enabling to constitute the tuning amplifier section by eliminating the aforementioned resistors 22, 42. Alternatively, either one of the two resistors 22, 42 may be eliminated from the tuning amplifier section.

Figure 24:
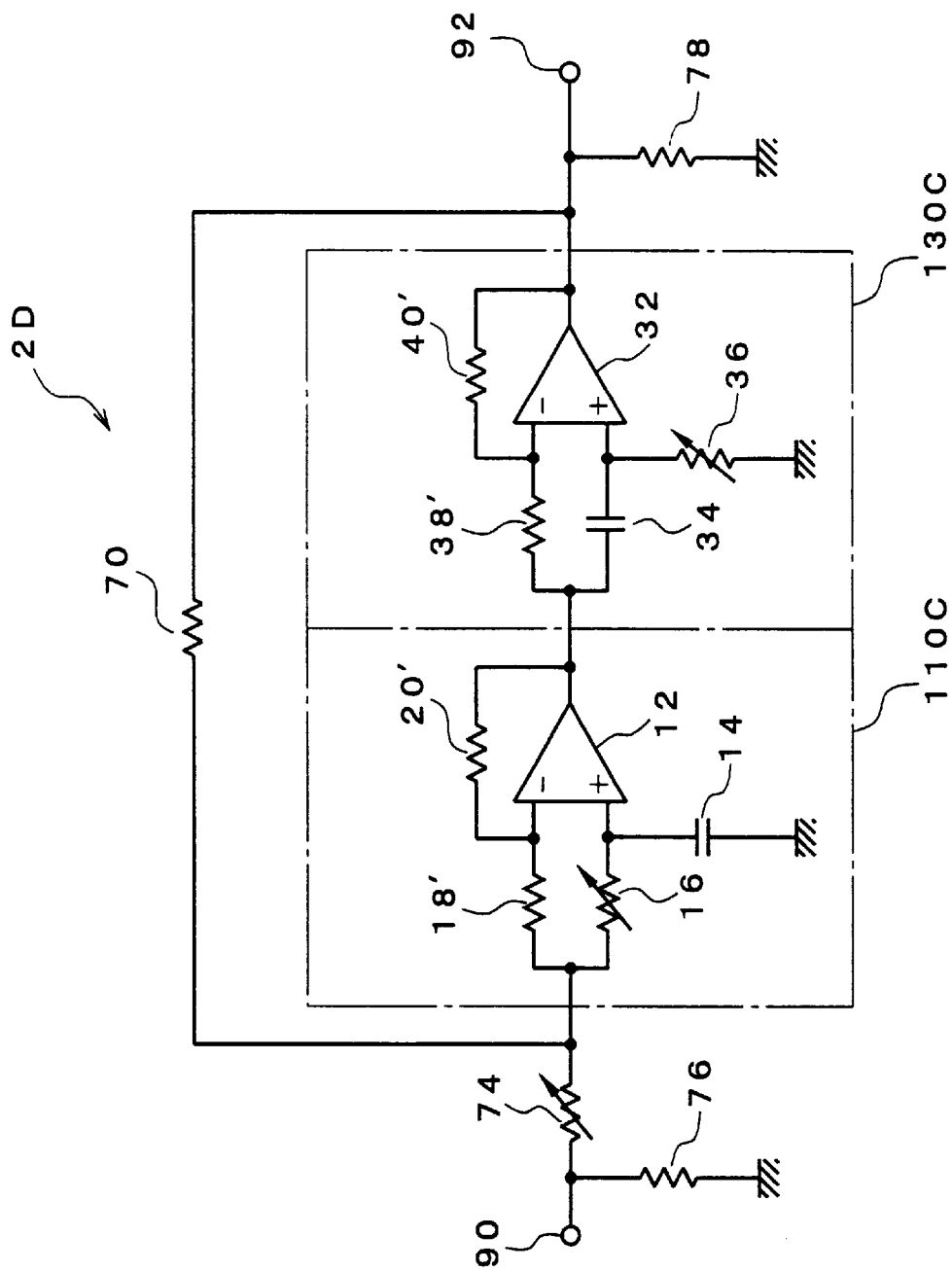
FIG. 24 is a circuit schematic of still another tuning amplifier section.

Illustrated in FIG. 24 is a circuit schematic of another embodiment of the tuning amplifier section. In this embodiment, the phase shifting circuits are configured by eliminating the resistors 22, 42 included in the phase shifting circuits 110C, 130C in the tuning amplifier section 2C as shown in FIG. 20.

It is to be noted that the present invention is not limited only to the above mentioned embodiments and that various modifications can be made without departing from the scope of the present invention.

For example, the variable resistors 16, 36 included in the tuning amplifier sections constituting the above tuning circuits may be replaced by channel resistances of junction type or MOS type FETs for convenience of integrating on a semiconductor substrate. In such case, resistance between the source and drain electrodes of such FET can be controlled by varying the gate voltage.

Also, the variable resistors 16, 36 may be configured using a parallel connection of a p-channel and n-channel FETs. A variable resistor comprising a combination of such FETs helps to improve linearity of the FETs, thereby providing a tuning output with minimum distortion.

Although variable resistors are included in the two phase shifting circuits of the aforementioned various tuning amplifier sections, a variable resistor may be included in either one of the phase shifting circuits to control the tuning frequency. The use of a variable resistor in each of the two phase shifting circuits is advantageous to provide a wider variable range of the tuning frequency. In case of including a variable resistor in only one phase shifting circuit, it is advantageous to easily control the tuning frequency.

It is also possible to form the variable resistor by using a PIN diode through which a variable current is made to flow, thereby controlling the resistance between both ends of the PIN diode.

Also, in the phase shifting circuit having a CR circuit, the time constant of such CR circuit may be varied by controlling the capacitance of the capacitor instead of controlling the resistance of the resistor, thereby varying the phase shift of the phase shifting circuit or the tuning frequency of the tuning amplifier section.

More in detail, the capacitor (for example the capacitor 14 in FIG. 3) constituting the CR circuit is replaced by a variable capacitance diode and a DC blocking capacitor. Application of a variable reverse bias voltage to the variable capacitance diode varies the capacitance between the anode and the cathode. If a CR circuit is formed with a series connection of such variable capacitance diode and a resistor, the time constant of the CR circuit can be varied depending on the reverse bias voltage applied to the diode, thereby shifting the phase of the phase shifting circuit. Also, the variable capacitance diode may be replaced by an FET whose gate capacitance varies in certain range depending on the control voltage to the gate.

Similarly, in a phase shifting circuit having an LR circuit, the time constant of the LR circuit may be controlled by varying the inductance of a variable inductor instead of varying the resistance of a variable resistor, thereby shifting the phase of the phase shifting circuit or varying the tuning frequency of each tuning amplifier section.

Figure 25:
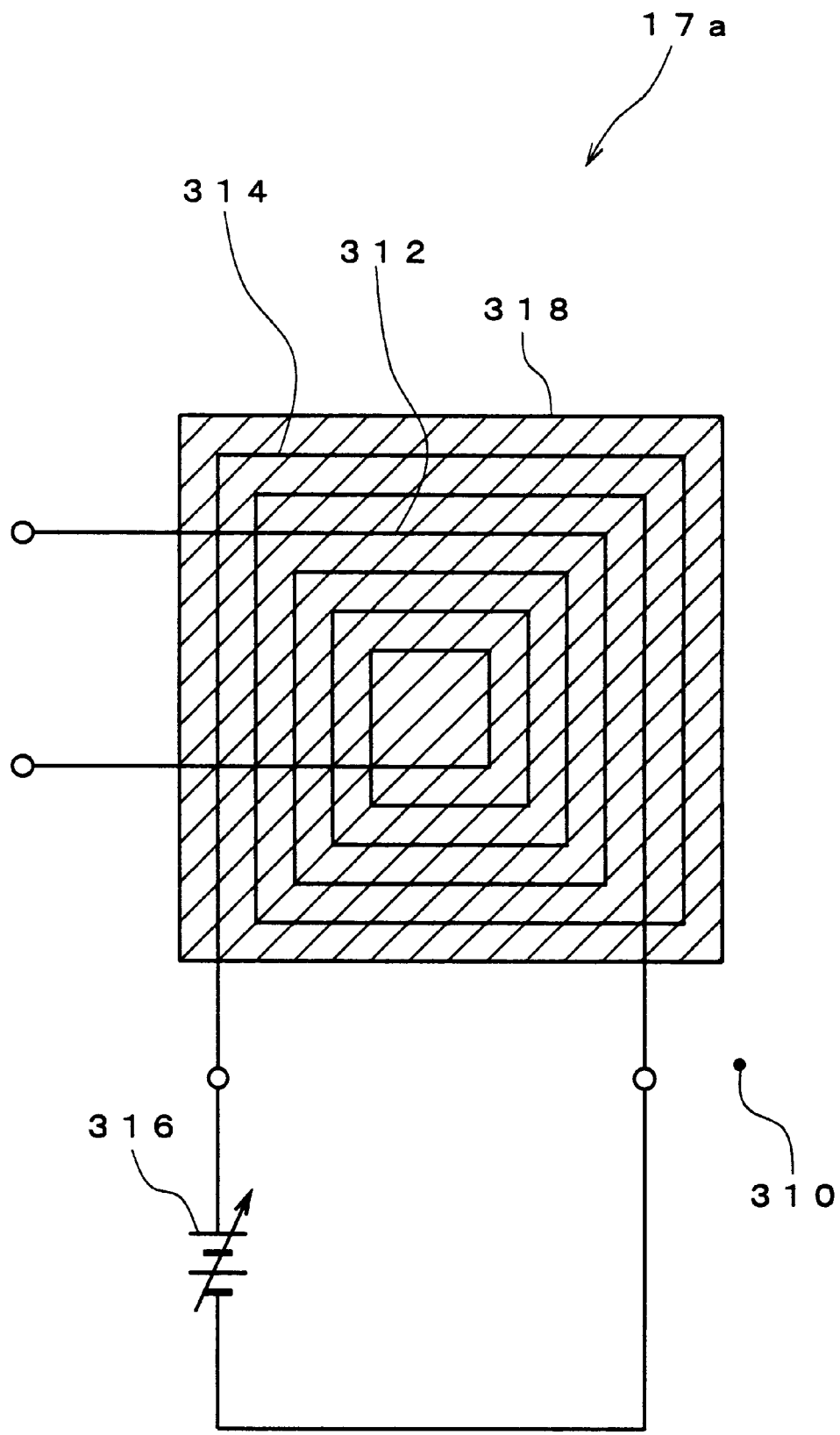
FIG. 25 is an example of a variable inductor.

Illustrated in FIG. 25 is a simplified planar configuration of a variable inductor formed on a semiconductor substrate.

The variable inductor 17a shown in FIG. 25 comprises a spiral shaped inductor conductor 312 formed on a semiconductor substrate 310, a control conductor 314 formed about the inductor conductor 312 and an insulating magnetic member 318 covering the inductor conductor 312 and the control conductor 314.

The above mentioned control conductor 314 is designed to be connected to a variable voltage source 316 at both ends of the control conductor 314. By controlling the DC bias voltage of the variable voltage source 316, a variable bias current flows through the control conductor 314.

The semiconductor substrate 310 may be made from, for example, n-type silicon substrate (n-Si substrate) or any other semiconductor material (for example, amorphous material such as germanium, amorphous silicon, etc.). The inductor conductor 312 may be made from a thin film of aluminum, gold, etc. or polysilicon or other semiconductor material in spiral form. Note that formed on the semiconductor substrate 310 are variable inductor 17a and other components of the tuning amplifier section as shown in FIG. 2, etc.

Figure 26:
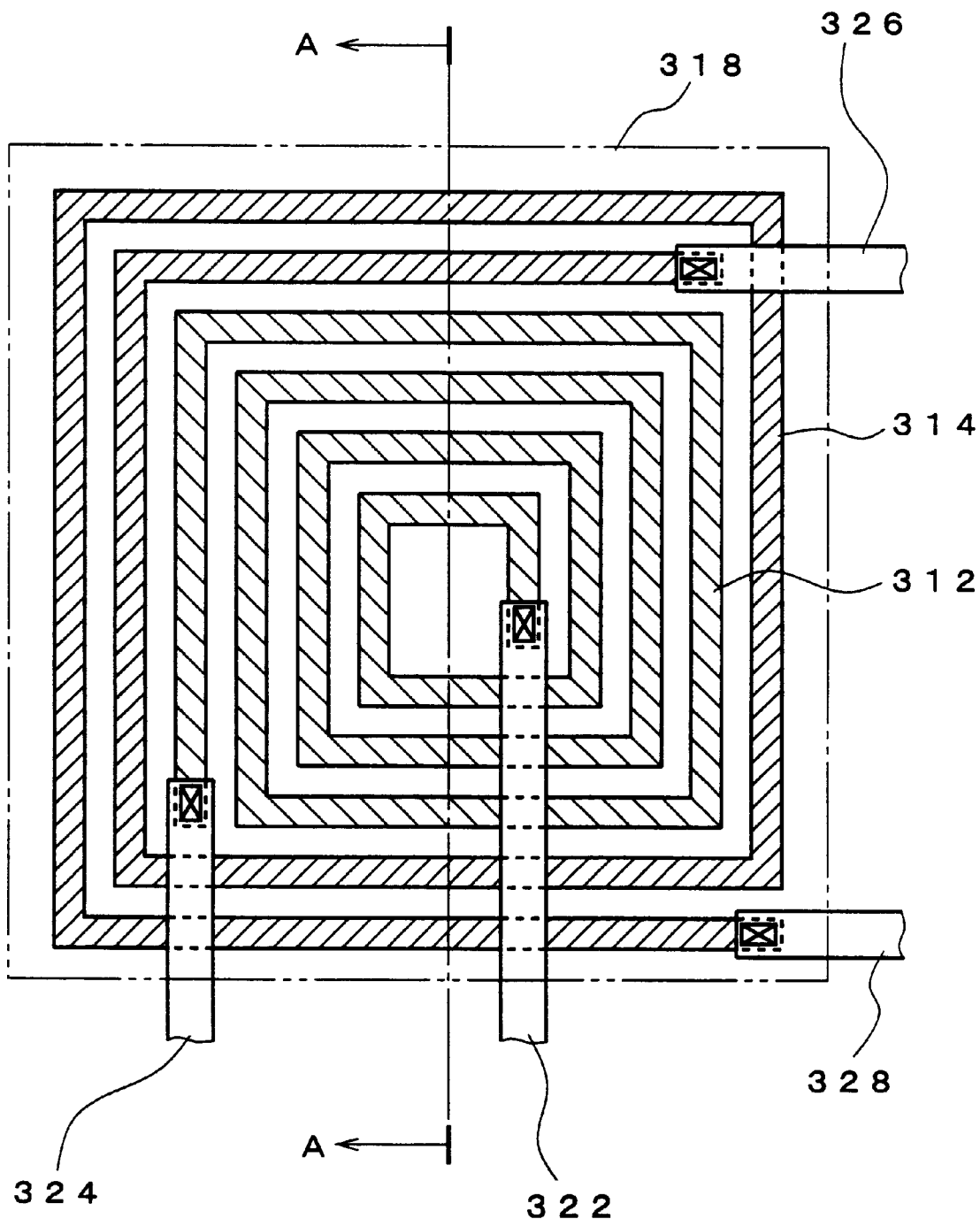
FIG. 26 shows the inductor conductor of the variable inductor in FIG. 25 and control conductors in greater detail.

Illustrated in FIG. 26 is a more detailed view of the inductor conductor 312 and the control inductor 314 constituting the variable inductor 17a as shown in FIG. 25.

As apparent from FIG. 26, the inductor conductor 312 is in a spiral form of a desired number of turns (for example 4 turns) inside the control conductor 314 and has a pair of terminal electrodes 322, 324 at both ends. Similarly, the control conductor 314 outside of the inductor conductor 312 is in a spiral form of a desired number of turns (for example 2 turns) and has a pair of terminal electrodes 326, 328 at both ends.

Figure 27:
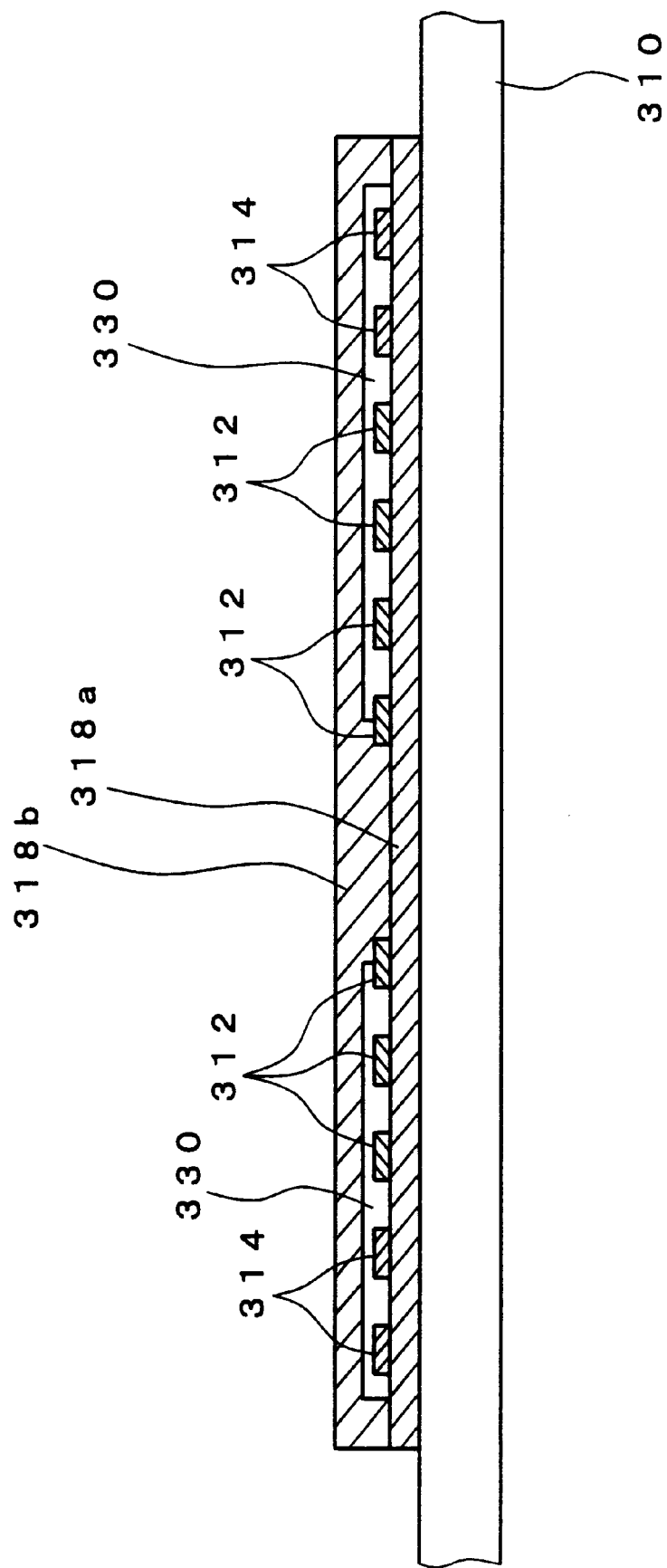
FIG. 27 is a magnified cross section view along line A—A in FIG. 26.

Now, illustrated in FIG. 27 is a magnified cross section view of the insulative magnetic member 318 including the inductor conductor 312 and the control conductor 314 along the line A—A in FIG. 26.

As best shown in FIG. 27, the inductor conductor 312 and the control conductor 314 are formed on the surface of the semiconductor substrate 310 by way of an insulative magnetic layer 318a. Also, another insulative magnetic layer 318b is coated over the conductors 312 and 314. The insulative magnetic member 318 as shown in FIG. 25 is defined by the two magnetic layers 318a and 318b.

The magnetic layers 318a and 318b may be made from, for example, gamma ferrite, barium ferrite, or other magnetic materials. Various materials and methods of making the magnetic member are available. For example, the magnetic layer may be made by vacuum deposition, molecule beam epitaxy (MBE method), chemical vapor deposition (CVD method), or sputtering method of, for example, FeO or other materials.

It is to be noted that an insulation layer 330 of non-magnetic material is disposed to cover the inductor conductor 312 and the control conductor 314. Displacing the magnetic layer 318a and 318b from the periphery of the conductors 312, 314 helps to minimize leakage magnetic flux in this area, thereby providing a variable inductor 17a having a large inductance by effective use of the magnetic flux generated by the inductor conductor 312.

Such variable inductor 17a as shown in FIG. 25, etc. comprises the insulative magnetic member 318 (magnetic layers 318a and 318b) covering the inductor conductor 312 and the control conductor 314. A variable DC bias current is made to flow through the control conductor 314, thereby varying the saturated magnetization characteristic of the inductor conductor 312 having the insulative magnetic member 318 as its magnetic path. As a result, the inductance of the inductor conductor 312 is controlled.

The inductance of the inductor conductor 312 can be directly controlled and can be fabricated easily on the semiconductor substrate 310 using conventional thin film forming and semiconductor fabrication processes. Additionally, other circuit components and devices of the tuning amplifier section 2 may be formed on the semiconductor substrate 310, thereby enabling to form the entire tuning circuit 1 as an integrated circuit.

It is to be understood that the inductor conductor 312 and the control conductor 314 may be formed in a spiral manner alternately or superimposed to obtain the variable inductor 17a in FIG. 25. In any example, the DC bias current through the control conductor 314 is controlled to alter the saturation magnetization characteristic of the insulative magnetic member 318, thereby varying the inductance of the inductor conductor 312 over a certain range.

Although the variable inductor 17a in FIG. 25 is described to form the inductor conductor 312 on the semiconductor substrate 310, the inductor conductor 312 may be formed on any insulative or conductive substrate including ceramic, etc.

Also, an insulative material is used as the magnetic layers 318a, 318b in the above example, metal powder (MP) or other conductive material may be used so long as each inductor conductor is electrically insulated from such conductive magnetic layers to avoid shunting of the inductor conductor. Such insulation may be realized by forming an oxide film on the inductor conductor 312 or by forming a silicon oxide or nitride film by chemical vapor deposition or other technique.

In particular, electrically conductive magnetic materials such as metal powder tend to have higher magnetic permeability as compared with insulative magnetic materials such as gamma ferrite, thereby making them effective to increase the inductance.

In the variable inductor 17a in FIG. 25, both inductor conductor 312 and the control inductor 314 are entirely covered with the insulative magnetic member 318. However, a part of the conductors 312, 314 may be covered to form the magnetic path. In case of partly forming the magnetic path by the insulative (or conductive) magnetic member, the magnetic flux generated by the inductor conductor 312 and the control conductor 314 tends to saturate easily due to reduced magnetic path. This means that a small bias current in the control conductor 314 may saturate the flux, thereby enabling to control the inductance of the inductor conductor 312 using a small bias current. This helps to simplify the control circuit.

Although the inductor conductor 312 and the control conductor 314 in the variable inductor 17a in FIG. 25 are formed in a concentric spiral manner, these conductors 312, 314 may be formed at adjacent locations on the semiconductor substrate 310 with insulative or conductive magnetic member therebetween for forming a magnetic path for magnetic coupling between the both conductors.

Figure 28:
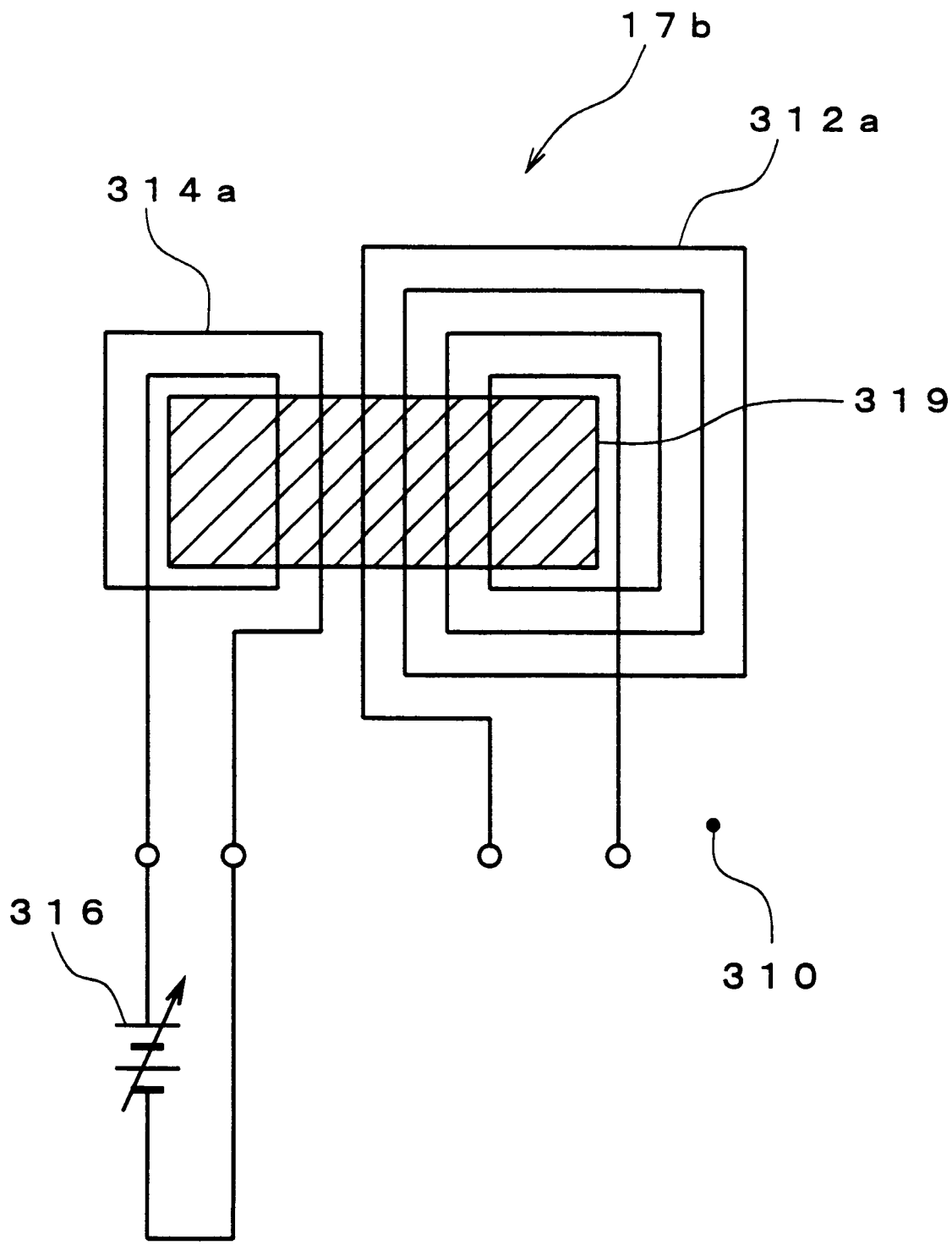
FIG. 28 is another example of a variable inductor.

Illustrated in FIG. 28 is a plan view of a variable inductor 17b including side-by-side inductor and control conductors.

The variable inductor 17b as shown in FIG. 28 comprises a spiral form inductor conductor 312a formed on a semiconductor substrate 310, a spiral form control conductor 314a formed at an adjacent location to the inductor conductor 312a, and an insulative (or conductive) magnetic member 319 covering center portions of the both spiral conductors 312a, 314a.

Similar to the variable inductor 17a in FIG. 25, connected to the control conductor 314a at both ends thereof is a variable voltage source 316 to apply a variable bias voltage. Controlling the bias voltage by the variable voltage source 316 varies the bias current through the control conductor 314a.

The above mentioned variable inductor 17b has an annular insulative magnetic member 319 (magnetic layers 319a, 319b) passing through the centers of the spiral inductor conductor 312a and the control conductor 314a. Controlling the DC bias current to flow through the control conductor 314a varies the saturation magnetization characteristic of the magnetic member 319 to define the magnetic path to the inductor conductor 312a, thereby varying the inductance of the inductor conductor 312a.

In a case where various tuning amplifier sections mentioned above are formed on a semiconductor substrate, it is difficult to form a capacitor 14 and the like having a large capacitance. It is therefore convenient to increase the apparent capacitance of such capacitor formed on a semiconductor substrate by using a circuit, thereby increasing the time constant T and thus decreasing the tuning frequency.

Figure 29:
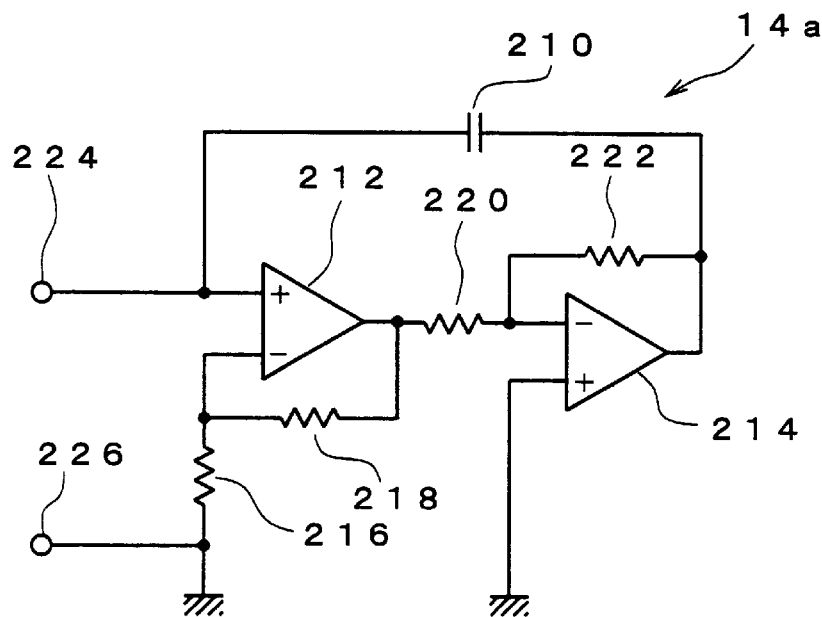
FIG. 29 is a circuit schematic of a capacitance converter circuit to magnify apparent capacitance of a capacitor.

Illustrated in FIG. 29 is an alternative example of a capacitor 14 and the like integrated with a circuit for use with the phase shifting circuit 10C in FIG. 3 and the like. This is a capacitance converter circuit to increase the apparent capacitance of the actual capacitor formed on a semiconductor substrate. The entire circuit of the capacitance converter circuit as shown in FIG. 29 is used as the capacitor 14 in the phase shifting circuit 10C.

The capacitance converter circuit 14a in FIG. 29 comprises a capacitor 210 having a capacitor C0, a pair of operational amplifiers 212, 214 and four resistors 216, 218, 220, and 222.

The first stage operational amplifier 212 includes the resistor 218 (having resistance R18) connected between the output terminal and the inverting input terminal and the resistor 216 (having resistance R16) connected between the inverting input terminal and ground.

Now, there is a relationship given by the following expression (17) between the voltage E1 applied to the non-inverting input terminal and the voltage E2 appearing on the output terminal of the first stage operational amplifier 212:

$$E2=(1+R18/R16)E1 \qquad (17)$$

The primary function of the first stage operational amplifier 212 is a buffer for impedance conversion and the gain of the first stage operational amplifier 212 may be 1. The unity gain is achieved when R18/R16=0, i.e., when R16 is ∞ (removing the resistor 216) or when R18 is 0 (directly connecting).

On the other hand, the second stage operational amplifier 214 includes the resistor 222 (having resistance R22) connected between the output terminal and the inverting input terminal and the resistor 220 (having resistor R20) connected between the inverting input terminal and the output terminal of the above operational amplifier 212. Also, the non-inverting input terminal is returned to ground.

Let the voltage appearing on the output terminal of the second stage operational amplifier 214 be E3, there is the following relationship between the voltage E3 and the output voltage E2 from the first stage operational amplifier 212:

$$E3 = -(R22/R20)E2 \quad (18)$$

As understood from the above expression (18), the second stage operational amplifier 214 acts as an inverting amplifier and the first stage operational amplifier 212 is used to establish a high input impedance of the second stage operational amplifier 214.

Now, connected between the non-inverting input terminal of the first stage operational amplifier 212 and the output terminal of the second stage operational amplifier 214 is the capacitor 210 having the above capacitance C0.

Figure 30:
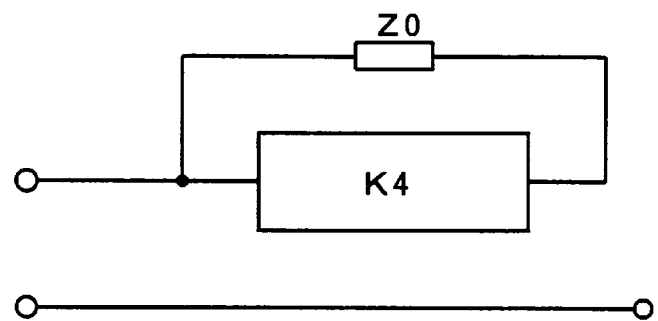
FIG. 30 is a diagram of the circuit in FIG. 29 using a transfer function.

If the transfer function of the entire circuit of the capacitance converter circuit 14a in FIG. 29, excluding the capacitor 210 is K4, the capacitance converter circuit 14a can be represented by the system diagram in FIG. 30. Illustrated in FIG. 31 is a system diagram of the circuit in FIG. 30 further converted by using the Miller's principle.

Figure 31:
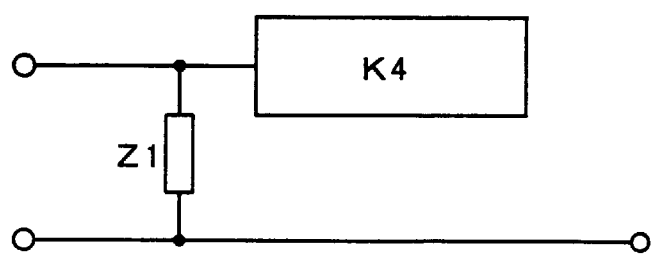
FIG. 31 is a diagram of the circuit in FIG. 30 converted by using the Miller's principle.

The impedance Z1 in FIG. 31 can be represented by the following expression (19) by using the impedance Z0 in FIG. 30:

$$Z1 = Z0/(1-K4) \quad (19)$$

In the capacitance converter circuit 14a in FIG. 29, the impedance $Z0 = 1/(j\omega C0)$. This is incorporated in the expression (19) to obtain the following expressions (20), (21):

$$Z1 = (1/(j\omega C0))/(1-K4) \quad (20)$$
$$= 1/\{j\omega((1-K4)C0)\}$$

$$C = (1-K4)C0 \quad (21)$$

The above expression (21) suggests that the apparent capacitance of the capacitor 210 having the capacitance C0 in the capacitance converter circuit 14a is increased to (1−K4) times of C0. As a result, if the gain K4 of the amplifier is negative, (1−K4) is always greater than 1, thereby increasing the capacitance C0.

Incidentally, the gain of the amplifier in the capacitance converter circuit 14a in FIG. 29, i.e., the gain K4 of the amplifier comprising the entire operational amplifiers 212, 214 can be determined from the above expressions (17) and (18) as follows:

$$K4 = -(1 + R18/R16)R22/R20 \quad (22)$$

Now, incorporating the above expression (22) with the expression (21), $$C = \{1 + (1 + R18/R16)R22/R20\}C0 \quad (23)$$

By proper setting of the resistances of the four resistors 216, 218, 220 and 222, the apparent capacitance C between the two terminals 224, 226 can be increased.

In case of the gain of the first stage operational amplifier 212 is 1, i.e., when R16 is set ∞ (by removing the resistor 216) or R18 is 0 Ω so that R18/R16=0, the above expression (23) can be simplified as follows:

$$C = (1 + R22/R20)C0 \quad (24)$$

As apparent from the above expression (24), the above capacitance converter circuit 14a acts to increase the apparent capacitance of the capacitor 210 formed on the semiconductor substrate larger than the actual capacitance C0 by varying the resistance ratio R18/R16 of the resistors 216, 218 or R22/R20 of the resistors 220, 222. In case of forming the entire tuning amplifier section in FIG. 2 on a semiconductor substrate, the capacitor 210 having a small capacitance C0 on a semiconductor substrate and the apparent capacitance C can be increased by the circuit as shown in FIG. 29, thereby making it particularly suitable for integrated circuit. Especially, if it is possible to establish a larger capacitance, the area for forming the tuning amplifier section can be reduced, thereby reducing the material cost.

Also, at least one of the resistors 216, 218, 220, 222 is made as a variable resistor, more particularly by a junction type or MOS type FET or parallel connection of a p-channel FET and an n-channel FET, thereby easily forming a variable capacitance capacitor. The use of such capacitor replacing the variable capacitance diode helps to control the phase shift over a certain range. This enables to control the frequency at which the phase shift of the tuning amplifier section is 0° in a loop.

Since the first stage operational amplifier 212 is used as a buffer to increase the input impedance as described above, the operational amplifier 212 may be replaced by an emitter follower circuit or a source follower circuit.

Although in FIG. 29 an amplifier having a predetermined gain and a capacitor are combined to increase the apparent capacitance higher than the capacitance of the actual capacitance element, an inductor may be used instead of the capacitor and the apparent inductance of such inductor will be increased.

The impedance Z1 as shown in FIG. 31 is given by the expression (19) by using the impedance Z0 as shown in FIG. 30. In case of an inductor having the inductance L0, the impedance $Z0 = j\omega L0$. This is incorporated with the expression (19), then $$Z1 = j\omega L0/(1-K4) = j\omega L\{L0/(1-K4)\} \quad (25)$$

$$L = L0/(1-K4) \quad (26)$$

This expression (26) shows that the actual inductor element is increased in apparent by 1/(1−K4) times. If the gain K4 is set to any value between 0 to 1, the apparent capacitance is increased.

Figure 32:
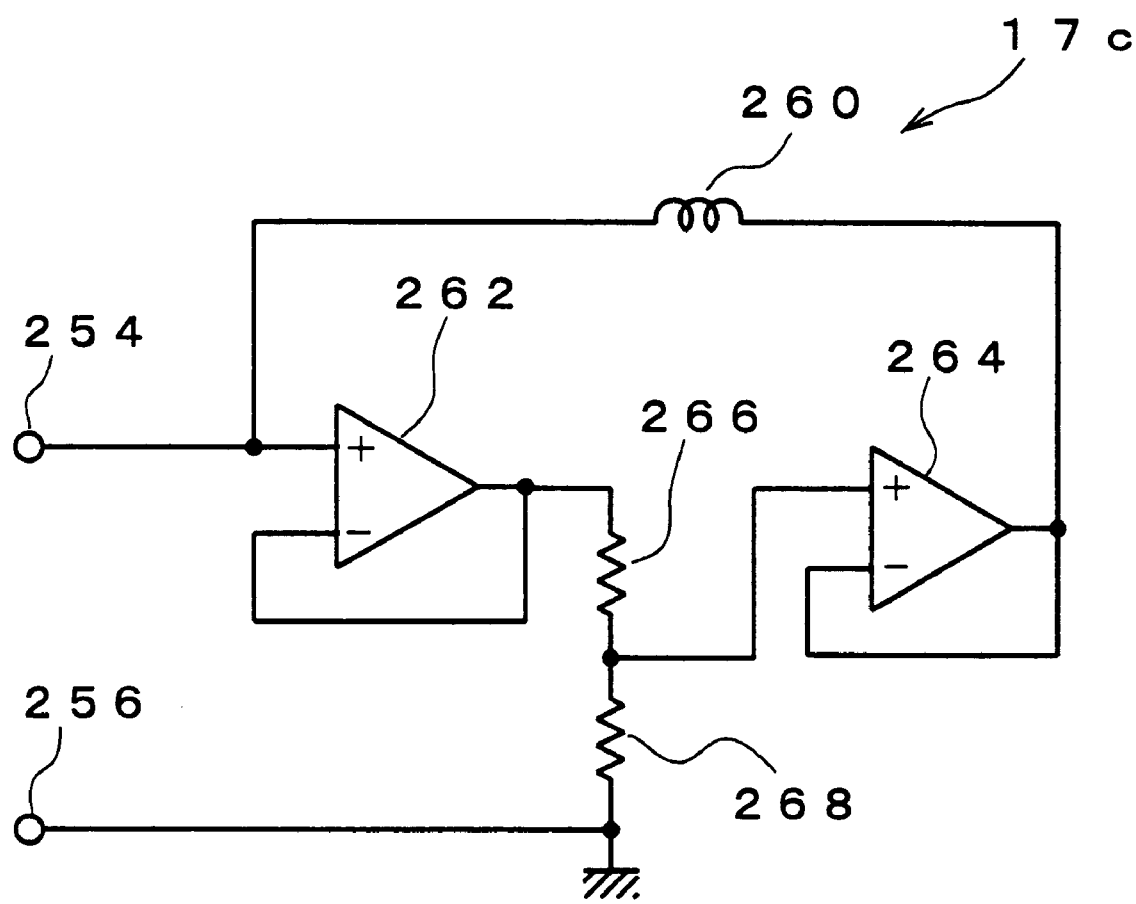
FIG. 32 is a circuit schematic of an inductance converter circuit to magnify apparent inductance of an inductor.

Now, illustrated in FIG. 32 is an alternative circuit to replace the inductor 17 within the phase shifting circuit 10L as shown in FIG. 14. The circuit in FIG. 32 is an inductance converter circuit to increase the apparent inductance of the inductor element (inductor conductor) formed on a semiconductor substrate.

The inductance converter circuit 17c in FIG. 32 comprises an inductor 260 having a given inductance L0, a pair of operational amplifiers 262, 264 and a pair of resistors 266, 268.

The first stage operational amplifier 262 is a unity gain non-inverting amplifier having its output terminal coupled to its inverting input terminal, thereby acting as a buffer primarily for impedance converter. Similarly, the second stage operational amplifier 264 has its output terminal coupled to its inverting input terminal to act as a unity gain non-inverting amplifier. Also included between the two non-inverting amplifiers is a voltage dividing circuit comprising resistors 266, 268.

By inserting the voltage dividing circuit, the overall gain of the amplifier including the two operational amplifiers can be set to any value between 0 to 1.

In the inductance converter circuit 17c in FIG. 32, let the transfer function of the entire circuit (amplifier) excluding the inductor 260 be K4, the gain K4 is determined by the dividing ratio of the voltage dividing circuit comprising the resistors 266, 268. If the resistances of the resistors 266 and 268 are R66 and R68, K4 is given by the following expression (27):

$$K4 = R68/(R66+R68) \quad (27)$$

The gain K4 is incorporated with the above expression (26) to calculated the apparent inductance, $$L = L0/\{1 - R68/(R66 + R68)\} \quad (28)$$
$$= (1 + R68/R66)L0$$

As a result, by increasing the resistance ratio R68/R66 of the resistors 266 and 268, the apparent inductance L between two terminals 254 and 256 can be increased. For example, in case of R68=R66, it is understood from the above expression (28) that the apparent inductance L is twice as large as L0.

As a result, the above mentioned inductance converter circuit 17c is useful for increasing the apparent inductance by controlling the dividing ratio of the voltage dividing circuit interposed between the two non-inverting amplifiers as composed with the actual inductance L0 of the inductor 260. This is particularly advantageous in case of forming the tuning amplifier section on a semiconductor substrate because the inductor 260 having a small inductance L0 may be formed on a semiconductor substrate by a spiral conductor and converting it into a larger inductance L by the inductance converter circuit as shown in FIG. 32. Especially, if the inductance can be increased to a certain large value, the tuning frequency of the tuning amplifier section can be extended to a lower frequency range. Additionally, forming the entire circuit as an integrated circuit, the tuning amplifier section requires a small area, thereby reducing the material cost.

Other than fixing the dividing ratio of the voltage dividing circuit comprising the resistors 266, 268, at least one of the two resistors 266, 268 may be made by a variable resistor, for example, by a parallel connection of p-channel and n-channel FETs, a junction type FET or a MOS type FET so that the dividing ratio may be continuously variable. In such case, the gain of the entire amplifier including the two operational amplifiers 262, 264 in FIG. 32 varies, thereby providing a continuously variable inductance L between the two terminals 254, 256. The use of such inductance converter circuit 17c instead of a variable inductor helps to provide a variable phase shift of the phase shifting circuit in a certain range. As a result, the frequency to provide 360° phase shift in the loop of the tuning amplifier section can be altered, thereby controlling the tuning frequency to a desired value.

Since the gain of the entire amplifier including the two operational amplifiers 262, 264 constituting the inductance converter circuit 17c in FIG. 32 is set less than 1, the entire circuit may be replaced by an emitter follower circuit or a source follower circuit.

Although a highly stable circuit is realized in the above mentioned tuning amplifier sections by using the phase shifting circuit 10C including operational amplifiers, such operational amplifiers in each phase shifting circuit may be replaced by differential input amplifiers having a given amplification factor because offset voltages and voltage gains are not critical in the particular applications such as in the phase shifting circuits 10C, 30C, etc.

Figure 33:
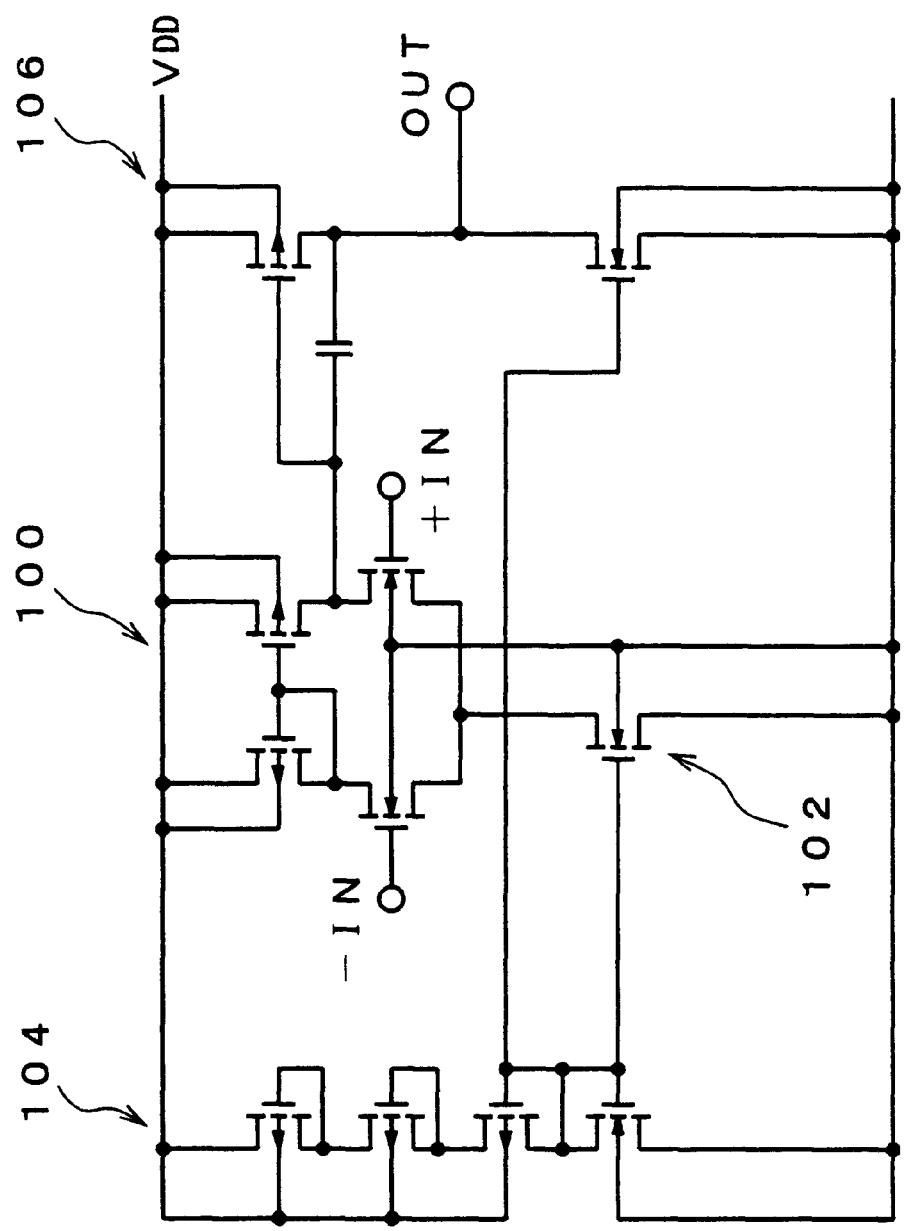
FIG. 33 is a circuit schematic of an important circuit in an operational amplifier operating as a phase shifting circuit.

Now, illustrated in FIG. 33 is a detailed circuit schematic of a circuit portion for phase shift operation in the operational amplifier. This is a differential input amplifier having a predetermined gain. The differential input amplifier in FIG. 33 comprises a differential input stage 100 including FETs, a constant current circuit 102 to provide a constant current to the differential input stage 100, a bias circuit 104 to provide a given bias voltage to the constant current circuit 102, and an output amplifier 106 coupled to the differential input stage 100. As shown in FIG. 33, multi-stage amplifier circuits to acquire a voltage gain in an actual operational amplifier are eliminated to simplify the differential input amplifier, thereby achieving a wide band operation. Such simple circuit helps to increase the upper operation frequency limit and thus increasing the upper limit of the tuning frequency of the tuning amplifier section by using such differential input amplifier.

Although the above mentioned tuning circuit is described to have a pair of identical tuning amplifier sections 2 and 3, it is possible to cascade connect two different types of tuning amplifier sections. For example, the tuning amplifier section 2 in FIG. 2 may be combined with the tuning amplifier section 2C in FIG. 20. Also, needless to say that two or more tuning amplifier sections may be connected in any desired order.

The phase shifting circuit 10C included in the tuning amplifier section 2 in FIG. 2 and the phase shifting circuit 110C included in the tuning amplifier section 2C in FIG. 20 operate as full band pass circuits. It is, therefore, possible to configure the tuning amplifier section by interchanging the phase shifting circuits having the same phase shift direction (for example the phase shifting circuits 10C and 110C or the phase shifting circuits 30L and 130L).

INDUSTRIAL APPLICABILITY

As understood from the above descriptions by reference to preferred embodiments of the present invention, a wider tuning frequency bandwidth than the case of using a single tuning amplifier section can be achieved by the cascade connection of a plurality of tuning amplifier sections with identical or mutually shifted tuning frequency or frequencies each including a pair of full band pass type phase shifting circuits and an adding circuit to add both input and feedback signals, thereby assuring a maximum attenuation.

Additionally, the entire tuning circuit can be easily configured as an integrated circuit especially when the pair of phase shifting circuits in each tuning amplifier section include CR circuits. Similarly, if the pair of phase shifting circuits include LR circuits, small inductors may be formed by an integrated circuit technology, thereby providing higher tuning frequencies without any difficulty. In a case of using a CR circuit in one phase shifting circuit while an LR circuit in the other phase shifting circuit, operational performances can be stabilized regardless of temperature and other factors.

We claim:

1. A tuning circuit including a plurality of cascade connected tuning amplifier sections each having substantially equal tuning frequency, each of said tuning amplifier sections comprising:

an adding circuit for adding an input signal applied to one end of an inpout impedance element and a feedback signal applied to one end of a feedback impedance;

a pair of phase shifting circuits of mutually opposite phase shift directions including a series circuit of a first resistor and a capacitor or an inductor and a differential input amplifier; and a first voltage dividing circuit for dividing an input AC signal thereto by a desired dividing ratio;

wherein said pair of phase shifting circuits and said first voltage dividing circuit are connected in a cascade manner, the added signal from said adding circuit is applied to the input stage of said plurality of cascade connected circuits, the output from the final stage circuit is applied through said voltage dividing circuit to the one end of said feedback impedance element, and the input to said voltage dividing circuit is derived as the output signal and wherein all constituent components are integrally formed on a semiconductor substrate.

2. A tuning ciruit including a plurality of cascade connected tuning amplifier sections having their tuning frequencies shifted by a given frequency, each of said tuning amplifier sections comprising:

an adding circuit for adding an input signal applied to one end of an input impedance element and a feedback signal applied to one end of a feedback impedance element;

a pair of phase shifting circuits of opposite phase shift directions to each other and including a series circuit of a first resistor and capacitor or an inductor, and a differential input amplifier; and a first voltage dividing circuit for dividing an input AC signal by a predetermined dividing ratio;

wherein said pair of phase shifting circuits and said first voltage dividing circuits are connected in a cascade manner, the added signal from said adding circuit is applied to the first stage circuit of said plurality of cascade connected circuits, an output signal from the final stage ciruit is applied through said voltage dividing circuit to the one end of said feedback impedance element as the feedback signal, and the signal to be applied to said voltage dividing circuit is derived as the output signal and wherein all constituent components are integrally formed on a semiconductor substrate.

3. A tuning circuit including a plurality of cascade connected tuning amplifier sections each having substantially equal tuning frequency, each of said tuning amplifier sections comprising:

an adding circuit for adding an input signal applied to one end of an input impedance element and a feedback signal applied to one end of a feedback impedance;

a pair of phase shifting circuits of mutually opposite phase shift directions including a series circuit of a first resistor and a capacitor or an inductor and a differential input amplifier; and a first voltage dividing circuit for dividing an input AC signal thereto by a desired dividing ratio;

wherein said pair of phase shifting circuits and said first voltage dividing circuit are connected in a cascade manner, the added signal from said adding circuit is applied to the input stage of said plurality of cascade connected circuits, the output from the final stage circuit is applied to the one end of said feedback impedance element, and the input to said voltage dividing circuit is derived as the output signal, wherein at least one of said pair of phase shifting circuits includes a second resistor connected to the inverting input terminal of said differential input amplifier through which an AC signal is applied, a second voltage dividing circuit connected to the output terminal of said differential amplifier, a third resistor interposed between the output of said second voltage dividing circuit and the inverting input terminal of said differential input amplifier, and said series circuit, and wherein the junction point of said first resistor and said capacitor or inductor constituting said series circuit is connected to the non-inverting input terminal of said differential input amplifier.

4. The tuning circuit of claim 3, wherein said differential input amplifier comprises an operational amplifier.

5. The tuning circuit of claim 3, wherein said second and third resistors are set to have an equal resistance to each other.

6. The tuning circuit of claim 3, wherein said input and feedback impedance elements are resistors of a variable resistance ratio for controlling the tuning frequency bandwidth of said tuning amplifier section.

7. The tuning circuit of claim 3, wherein the time constant of said series circuit is varied to obtain a variable tuning characteristic.

8. The tuning circuit of claim 7, wherein said first resistor included in said series circuit is variable to provide a variable resistance for controlling the tuning characteristic.

9. The tuning circuit of claim 8, wherein said variable resistor is formed by a parallel connection of p-channel and n-channel FETs to vary the channel resistances depending on the gate voltage.

10. The tuning circuit of claim 3, wherein a transistor follower circuit is interposed between said pair of phase shifting circuits and said adding circuit.

11. The tuning circuit of claim 3, wherein the dividing ratio of said second voltage dividing circuit is set to 1.

12. The tuning circuit of claim 3, wherein said inductor included in said series circuit is formed on a semiconductor substrate and comprises two spiral electrodes magnetically coupled together by way of a magnetic member to provide a variable DC bias current to one of said electrodes, thereby controlling the inductance of the other electrode.

13. The tuning circuit of claim 3, wherein said capacitor included in said series circuit comprises an amplifier having a negative gain and a capacitor element connected between the input and output of said amplifier to constitute a capacitance converter circuit.

14. The tuning circuit of claim 3, wherein said inductor included in said series circuit comprises on amplifier having the gain between 0 to 1 and an inductor element connected between the input and output of said amplifier to constitute an inductance converter circuit.

15. A tuning circuit including a plurality of cascade connected tuning amplifier sections each having substantially equal tuning frequency, each of said tuning amplifier sections comprising:

an adding circuit for adding an input signal applied to one end of an input impedance element and a feedback signal applied to one end of a feedback impedance;

a pair of phase shifting circuits of mutually opposite phase shift directions including a series circuit of a first resistor and a capacitor or an inductor and a differential input amplifier; and a first voltage dividing circuit for dividing an input AC signal thereto by a desired dividing ratio;

wherein said pair of phase shifting circuits and said first voltage dividing circuit are connected in a cascade manner, the added signal from said adding circuit is applied to the input stage of said plurality of cascade connected circuits, the output from the final stage circuit is applied to the one end of said feedback impedance element, and the input to said voltage dividing circuit is derived as the output signal, wherein at least one of said pair of phase shifting circuits includes a second resistor connected to the inverting input of said differential input amplifier through which an AC signal is applied, a third resistor interposed between the inverting input and output terminals of said differential input amplifier, a fourth resistor connected between the inverting input terminal of said differential input amplifier and ground, and said series circuit, and wherein the junction point of said first resistor and said capacitor or inductor constituting said series circuit is connected to the non-inverting input terminal of said differential input amplifier.

16. The tuning circuit of claim 15, wherein the said differential input amplifier comprises an operational amplifier.

17. The tuning circuit of claim 15, wherein the resistance of said third resistor is set higher than that of said second resistor.

18. The tuning circuit of claim 15, wherein said input and feedback impedance elements are resistors having a variable resistance ratio to control the tuning frequency bandwidth of said tuning amplifier section.

19. The tuning circuit of claim 15, wherein the time constant of said series circuit is varied to control the tuning characteristic.

20. The tuning circuit of claim 19, wherein said first resistor included in said series circuit is a variable resistor capable of controlling the tuning characteristic by adjusting said variable resistor.

21. The tuning circuit of claim 20, wherein said variable resistor is formed by a parallel connection of p-channel and n-channel FETs whose channel resistances are varied by controlling their gate voltage.

22. The tuning circuit of claim 15, wherein a transistor follower circuit is interposed between said pair of phase shifting circuits and said adding circuit.

23. The tuning circuit of claim 15, wherein said fourth resistor is removed.

24. The tuning circuit of claim 15, wherein said inductor included in said series circuit is formed on a semiconductor substrate and has a pair of spiral electrodes magnetically coupled to each other by way of a magnetic member with one electrode flowing a variable DC bias current to control the inductance of the other electrode.

25. The tuning circuit of claim 15, wherein said capacitor included in said series circuit comprises an amplifier having a negative gain and a capacitor element connected between the input and output of said amplifier to constitute a capacitance converter circuit.

26. The tuning circuit of claim 15, wherein said inductor included in said series circuit comprises an amplifier having a gain set between 0 to 1 and an inductor element connected between the input and output of said amplifier to constitute an inductance converter circuit.

27. A tuning circuit including a plurality of cascade connected tuning amplifier sections having their tuning frequencies shifted by a given frequency, each of said tuning amplifier sections comprising:
an adding circuit for adding an input signal applied to one end of an input impedance element and a feedback signal applied to one end of a feedback impedance element;
a pair of phase shifting circuits of opposite phase shift directions to each other and including a series circuit of a first resistor and a capacitor or an inductor, and a differential input amplifier; and
a first voltage dividing circuit for dividing an input AC signal by a predetermined dividing ratio;
wherein said pair of phase shifting circuits and said first voltage dividing circuit are connected in a cascade manner, the added signal from said adding circuit is applied to the first stage circuit of said plurality of cascade connected circuits, an output signal from the final stage circuit is applied to the one end of said feedback impedance element as the feedback signal, and the signal to be applied to said voltage dividing circuit is derived as the output signal, wherein at least one of said pair of phase shifting circuits comprises a second resistor connected to the inverting input terminal of said differential input amplifier to receive an AC signal therethrough, a second voltage dividing circuit connected to the output terminal of said differential input amplifier, a third resistor coupled between the output terminal of said second voltage dividing circuit and the inverting input terminal of said differential input amplifier, and said series circuit, and wherein the junction point of said first resistor and said capacitor or said inductor constituting said series circuit is connected to the non-inverting input terminal of said differential input amplifier.

28. The tuning circuit of claim 27, wherein the dividing ratio of said first voltage dividing circuit is set to 1.

29. The tuning circuit of claim 27, wherein said differential input amplifier comprises an operational amplifier.

30. The tuning circuit of claim 27, wherein said second and third resistors are chosen to have an equal resistance.

31. The tuning circuit of claim 27, wherein said input and feedback impedance elements are resistors having a variable resistance ratio to control the tuning frequency bandwidth of said tuning amplifier section.

32. The tuning circuit of claim 27, wherein the time constant of said series circuit is varied to control the tuning characteristic.

33. The tuning circuit of claim 32, wherein said first resistor included in said series circuit is a variable resistor to provide a variable resistance, thereby controlling the tuning characteristic.

34. The tuning circuit of claim 33, wherein said variable resistor is formed by a parallel connection of p-channel and n-channel FETs to provide variable channel resistances depending on the gate voltage.

35. The tuning circuit of claim 27, wherein a transistor follower circuit is interposed between said pair of phase shifting circuits and said adding circuit.

36. The tuning circuit of claim 27, wherein the dividing ratio of said second voltage dividing circuit is set to 1.

37. The tuning circuit of claim 27, wherein said inductor included in said series circuit has two spiral electrodes magnetically coupled to each other by way of a magnetic member with a variable DC bias current applied to one electrode while the other electrode providing a variable inductance.

38. The tuning circuit of claim 27, wherein said capacitor included in said series circuit is formed on a semiconductor substrate and comprises an amplifier having a negative gain, and a capacitor element connected between the input and output of said amplifier to constitute a capacitance converter circuit.

39. The tuning circuit of claim 27, wherein said inductor included in said series circuit comprises an amplifier having a gain set between 0 to 1 and an inductor element connected between the input and output of said amplifier to constitute an inductance converter circuit.

40. The tuning circuit of claim 27, wherein at least one of said pair of phase shifting circuits includes a second resistor connected to the inverting input terminal of said differential input amplifier through which an AC signal is applied, a third resistor connected between the inverting input terminal and the output terminal of said differential input amplifier, a fourth resistor coupled between the inverting input terminal of said differential input amplifier and ground and said series circuit, and wherein the junction point of said first resistor and said capacitor or inductor constituting said series circuit is connected to the non-inverting input terminal of said differential input amplifier.

41. The tuning circuit of claim 40, wherein said differential input amplifier comprises an operational amplifier.

42. The tuning circuit of claim 40, wherein the resistance of said third resistor is set larger than that of said second resistor.

43. The tuning circuit of claim 40, wherein said input and feedback impedance elements are resistors with their resistance ratio variable for controlling the tuning frequency bandwidth of said tuning amplifier section.

44. The tuning circuit of claim 40, wherein the time constant of said series circuit is varied to control the tuning characteristic.

45. The tuning circuit of claim 44, wherein said first resistor included in said series circuit is a variable resistor to provide a variable resistance for controlling the tuning characteristic.

46. The tuning circuit of claim 45, wherein said variable resistor comprises a parallel connection of p-channel and n-channel FETs to vary their channel resistances depending on the gate voltage.

47. The tuning circuit of claim 40, wherein a transistor follower circuit is interposed between said pair of phase shifting circuits and said adding circuit.

48. The tuning circuit of claim 40, wherein said fourth resistor is eliminated.

49. The tuning circuit of claim 40, wherein said inductor included in said series circuit is formed on a semiconductor substrate and includes a pair of spiral electrodes magnetically coupled together by way of a magnetic member with a variable DC bias current flowing in one electrode while varying the inductance of the other electrode.

50. The tuning circuit of claim 40, wherein said capacitor included in said series circuit comprises an amplifier having a negative gain and a capacitor element connected between the input and output of said amplifier to constitute a capacitance converter circuit.

51. The tuning circuit of claim 40, wherein said inductor included in said series circuit comprises an amplifier having a gain set between 0 and 1 and an inductor element connected between the input and output of said amplifier to constitute an inductance converter circuit.

52. The tuning circuit of any one of claims 3 through 27 and 29 through 51, wherein all constituent components are integrally formed on a semiconductor substrate.

53. The tuning circuit of claim 1, wherein the dividing ratio of said first voltage dividing circuit is set to 1.

54. The tuning circuit of any one of claims 53, and 28, wherein all constituent components are integrally formed on a semiconductor substrate.

* * * * *